(12) United States Patent  (10) Patent No.: US 8,148,358 B2
Hall-Goulle et al.  (45) Date of Patent: Apr. 3, 2012

(54) BLUE COLOUR FILTERS WITH ENHANCED CONTRAST

(75) Inventors: Véronique Hall-Goulle, Dornach (CH); Rebekka Zillhardt, Wittlingen (DE)

(73) Assignee: BASF SE, Ludwigshafen (DE)

( * ) Notice: Subject to any disclaimer, the term of this patent is extended or adjusted under 35 U.S.C. 154(b) by 780 days.

(21) Appl. No.: 12/223,140

(22) PCT Filed: Feb. 7, 2007

(86) PCT No.: PCT/EP2007/051154
§ 371 (c)(1),
(2), (4) Date: Jul. 23, 2008

(87) PCT Pub. No.: WO2007/093536
PCT Pub. Date: Aug. 23, 2007

(65) Prior Publication Data
US 2010/0227199 A1   Sep. 9, 2010

(30) Foreign Application Priority Data

Feb. 17, 2006 (EP) .................... 06110105
Mar. 1, 2006 (EP) .................... 06110553

(51) Int. Cl.
*A61K 31/33* (2006.01)
*B32B 9/04* (2006.01)
(52) U.S. Cl. .................... 514/183; 428/704
(58) Field of Classification Search .......... 428/704; 514/183
See application file for complete search history.

(56) References Cited

U.S. PATENT DOCUMENTS

| 4,244,691 | A | * | 1/1981 | Adam | 8/676 |
| 4,793,692 | A | | 12/1988 | Kamio et al. | 350/311 |
| 4,863,522 | A | | 9/1989 | Jost et al. | 106/494 |
| 5,834,122 | A | | 11/1998 | Teng et al. | 428/412 |
| 5,968,688 | A | | 10/1999 | Masuda et al. | 430/7 |
| 6,509,125 | B1 | | 1/2003 | Ito et al. | 430/7 |
| 6,512,643 | B1 | | 1/2003 | Wada et al. | 359/885 |
| 2001/0047740 | A1 | | 12/2001 | Wada et al. | 106/413 |
| 2005/0131114 | A1 | | 6/2005 | Sunahara et al. | 524/88 |
| 2005/0150061 | A1 | | 7/2005 | Lauk et al. | 8/509 |

FOREIGN PATENT DOCUMENTS

| DE | 3 509 198 | 11/1985 |
| EP | 0 273 866 | 7/1988 |
| EP | 0 633 296 | 1/1995 |
| EP | 0 695 955 | 2/1995 |
| EP | 0 833 203 | 4/1998 |
| EP | 1 102 092 | 5/2001 |
| EP | 1 130 065 | 9/2001 |
| GB | 623593 | 5/1949 |
| WO | 03/080734 | 10/2003 |
| WO | 2006/003120 | 1/2006 |

OTHER PUBLICATIONS

Derwent Abstract No. 93-348615/44 of JP 05255599-A, 1993.
Derwent Abstract No. 2003-357745/34 of JP 2002322380-A, 2003.
Derwent Abstract No. 2004-575425/56 of JP 2004217787-A, 2004.
Derwent Abstract No. 2000-218166/19 of JP 2000044822-A, 2000.

* cited by examiner

*Primary Examiner* — Rei-tsang Shiao
(74) *Attorney, Agent, or Firm* — Qi Zhuo

(57) ABSTRACT

The invention relates to a process for enhancing the contrast of color filters comprising α copper phthalocyanine or ε copper phthalocyanine, wherein a 1,4-diamino-anthraquinone dye or 1,9-annellated derivative thereof, of which the most bathochromic solution absorption peak in the visible spectrum is at from 575 to 615 nm, preferably at from 585 to 605 nm (as compared with around 630 nm for usual 1,4-diamino-anthraquinone dyes or 1,9-annellated derivatives thereof) is used in combination with α copper phthalocyanine or ε copper phthalocyanine. Also claimed are color filters comprising such 1,4-diamino-anthraquinone dyes or 1,9-annellated derivatives thereof, as well as a novel compound of Formula (II), wherein $R_{16}$ is halogen, phenyl, benzyl or $C_1$-$C_8$alkyl and $R_{17}$ is H, $R_{16}$ is H and $R_{17}$ is $C_1$-$C_8$alkyl, or $R_{16}$ and $R_{17}$ are both H; $R_{18}$ is H, halogen, $C_1$-$C_8$alkyl or $SO_2NR_{13}R_{14}$; $R_{19}$, $R_{20}$ and $R_{21}$ are each independently from the others halogen or $C_1$-$C_8$alkyl; and $R_{22}$ is independently from $R_{18}$ $SO_2NR_{13}R_{14}$, with the proviso that at least one of $R_{18}$ and $R_{22}$ is $SO_2NR_{13}R_{14}$, and two radicals of Formula (II) can optionally be linked together via a direct bond or a group —O—, —S—, —$NR_{14}$—, —CO—, —$CO_2$—, —$CONR_{14}$— or —$CO_2$— connecting together each a substituent $R_{16}$, $R_{17}$, $R_{18}$, $R_{19}$, $R_{20}$, $R_{21}$ and $R_{11}$ from both radicals of formula (II).

(II)

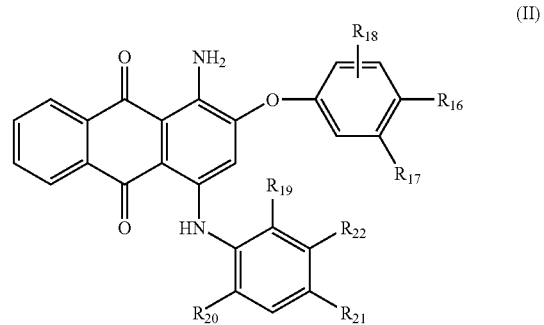

4 Claims, 1 Drawing Sheet

BLUE COLOUR FILTERS WITH ENHANCED CONTRAST

The invention relates to the field of color filters. The contrast of reddish-blue phthalocyanine colors filters is surprisingly enhanced by addition of a particular, soluble anthraquinone dye.

Normally, trichromatism is achieved by using one blue, one red and one green filter. These filters must be highly transparent, homogeneous and able to be prepared in a very uniform layer thickness.

The correct position and the absolute value of the transmission window are very important parameters for colour filters. There is a desire for high transmission in the wavelength range surrounding the light emission, coupled with as high as possible an absorption for different-colored light. In addition, there is a strongly increasing demand for a higher display contrast (ratio of luminances in the ON/OFF states).

Many blue filters are known and in some cases are available commercially. For light stability reasons, it is most preferred to use α copper phthalocyanine (Pigment Blue 15:1) and/or especially ε copper phthalocyanine (C. I. Pigment Blue 15:6) as main colorant, sometimes in combination with a small amount of carbazole violet (C. I. Pigment Violet 23).

DE-OS 35 09 198 discloses green colour filters comprising metal free (C. I. Pigment Blue 16), zinc or lead phthalocyanine combined with anthraquinone pigments.

EP 1 130 065 discloses a pigment composition comprising a wet-ground mixture of ε copper phthalocyanine and other pigments, amongst them carbazole violet. WO 02/04 563 is similar, with the difference that owing to particular kneading conditions, a solid solution of ε copper phthalocyanine and carbazole violet is obtained.

US 2005/0 131 114 proposes the use of a mixture of a blue pigment of specific surface area 90-140 $m^2/g$, such as α or preferably ε copper phthalocyanine, with a violet pigment of specific surface area 100-150 $m^2/g$, for example C. I. Pigment Violet 1, 19, 23, 27, 29, 30, 32, 37, 40, 42 or 50, preferably C. I. Pigment Violet 23, optionally together with an additional violet dyestuff or natural dye.

To increase the transmission of blue light, JP-A-2003/315 529 uses C. I. Pigment Violet 23 in combination with β copper phthalocyanine (C. I. Pigment Blue 15:3), which is much more greenish.

JP-A-2001/066 421 discloses red colour filters comprising anthraquinone derivatives of improved light stability.

JP-A-H05/255 599 discloses blue colour filters comprising 1,4-diphenylamino-anthraquinone colorants having sulfonamide substituents, in which the phenyl groups are further substituted by alkyl. JP-A-H08/179,120 further adds a 2-bromo substituent in both phenyl groups.

JP-A-2001/108 815 discloses that 1,4-diphenylamino-anthraquinone colorants in which the phenyl groups are further substituted by alkyl (but lacking any other substituents) provide the colour filters with superior spectral characteristics and contrast ratio. There are at least two different layers, which may comprise many further colorants, amongst which C. I. Pigment Blue 15:6.

JP-2002/322 380 discloses colour filters comprising blue, bis type anthraquinone dyes which exhibit a better transparency and contrast, as compared with mono anthraquinone dyes and a tri-sulfonamide derivative of copper phthalocyanine.

EP 0 695 955 and EP 0 833 203 disclose various resin compositions for colour filters, comprising for example anthraquinone or phthalocyanine colorants.

U.S. Pat. No. 4,793,692 discloses vapor-deposited green colour filters comprising octaphenylphthalocyanine and for example anthraquinone colorants. EP 1 102 092 discloses colour filters comprising pyridino-phthalocyanine and anthraquinone colorants.

U.S. Pat. No. 6,509,125 discloses multi-layered colour filters comprising polymer-immobilized colorants having an anthraquinone or triphenylmethane chromophore.

WO-03/080 734 discloses anthraquinone dyes for example of the formula

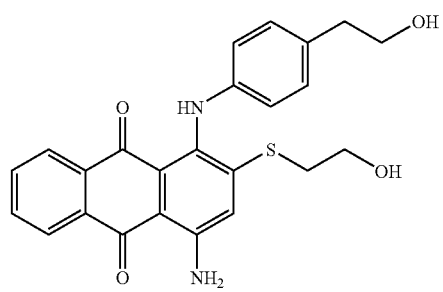

and their use for the mass-coloration of polymers, especially fibers, to produce uniformly colored materials. There is no hint of combination with other colorants in color filters.

It has been found, however, that these known filters do not fully meet the present-day requirements. The filters based on copper phthalocyanine have generally an excellent light stability, but the hue, the transparency and the contrast are not fully satisfactory. On the other hand, the filters based on blue anthraquinone colorants have a poorer light stability, while also lacking the optimal hue.

It has now surprisingly been found that the hue, the transparency and the contrast of pigmentary, reddish blue copper phthalocyanines in blue colour filters can be improved by the addition of certain anthraquinone compounds. The light stability and other pigmentary properties remain excellent.

Hence, the invention relates to a process for enhancing the contrast of colour filters comprising α copper phthalocyanine or ε copper phthalocyanine, wherein a 1,4-diamino-anthraquinone dye or 1,9-annellated derivative thereof, of which the most bathochromic dichloromethane solution absorption peak in the visible spectrum is at from 575 to 615 nm, preferably at from 585 to 605 nm,

- is added to α copper phthalocyanine or ε copper phthalocyanine and dispersed together with the copper phthalocyanine in a liquid medium;
- is added to a preliminary made suspension comprising a liquid and α copper phthalocyanine or ε copper phthalocyanine, which suspension is then dispersed;
- is added to a preliminary made dispersion comprising a liquid and α copper phthalocyanine or ε copper phthalocyanine; or
- is added to a liquid, followed by addition of α copper phthalocyanine or ε copper phthalocyanine and dispersion into the liquid;

the resulting dispersion comprising both α copper phthalocyanine or ε copper phthalocyanine and the 1,4-diamino-anthraquinone dye or 1,9-annellated derivative thereof is applied to a substrate; and a preferably patterned colour filter layer is formed by drying and/or curing.

The visible spectrum ranges from 400 to 700 nm. The absorption of the 1,4-diamino-anthraquinone dye or 1,9-annellated derivative thereof is adequately determined in dichloromethane at low concentration (for example 100 mg/l). Instead of dichloromethane, one can alternatively also use tetrahydrofuran or acetonitrile, especially if the solubility in dichloromethane is insufficient or aggregation occurs.

The 1,4-diamino-anthraquinone dye or 1,9-annellated derivative thereof can be used as a pure compound, or optionally as a mixture of several 1,4-diamino-anthra-quinone dyes or 1,9-annellated derivatives thereof of different structures, for example mixtures of isomers or homologues. Depending on its solubility in the liquid used for dispersing the copper phthalocyanine, the 1,4-diamino-anthra-quinone dye or 1,9-annellated derivative thereof dissolves partially or completely therein upon dispersion.

The dispersion may optionally further comprise customary components in customary amounts. Some customary components are described in more detail below.

The 1,4-diamino-anthraquinone dye or 1,9-annellated derivative thereof is suitably at least partially soluble in usual solvents. Thus, pigmentary colorants such as, for example, C. I. Pigment Violet 1, 19, 23, 27, 29, 30, 32, 37, 40, 42 or 50, are inadequate. Preferred are 1,4-diamino-anthraquinone dyes or 1,9-annellated derivatives thereof substituted by a $CONR_{13}R_{14}$ or a $SO_2NR_{13}R_{14}$ group as defined below.

The copper phthalocyanine preferably has an average particle size of from 0.01 μm to 0.3 μm, with particular preference from 0.02 μm to 0.2 μm, and with very particular preference from 0.04 μm to 0.1 μm. The copper phthalocyanine is preferably ε copper phthalocyanine (C. I. Pigment Blue 15:6). The 1,4-diamino-anthraquinone dye or 1,9-annellated derivative thereof is preferably substituted by a 3-oxy or 3-thio group, especially a 3-phenoxy or 3-phenylthio group.

The amount of copper phthalocyanine is preferably from 0.1 to 70% by weight, based on the total weight of the dispersion, and from 1 to 75% by weight, based on the weight of components of the dispersion which remain on the substrate after drying and/or curing. As described below more in detail, the dispersion usually comprises a binder or a polymerisable compound. The amount of the 1,4-diamino-anthraquinone dye or 1,9-annellated derivative thereof is preferably from 0.1 to 100% by weight, based on the weight of the copper phthalocyanine.

The 1,4-diamino-anthraquinone dye or 1,9-annellated derivative thereof is more preferably of formula

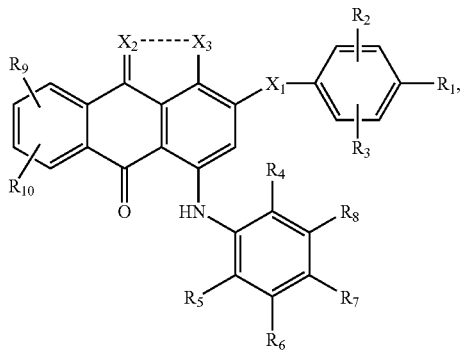

(I)

wherein $X_1$ is O or S;

$X_2$ is O and $X_3$ is $NH_2$ or $NHR_{11}$; or $X_2$ and $X_3$ are together =$C(R_{12})$—$CON(R_{11})$— or =N—$C(R_{12})$=N—;

$R_1, R_2, R_3, R_4, R_5, R_6, R_7, R_9$ and $R_{10}$ are each independently from all others H, halogen, CN, $CONR_{13}R_{14}$ or $COOR_{14}$, or benzyl or $C_1$-$C_{20}$alkyl which are unsubstituted or one or more times substituted by H, halogen, CN, $CONR_{13}R_{14}$ or $COOR_{14}$; or $R_2$ and/or $R_9$ are alternatively $SO_2NR_{13}R_{14}$;

$R_8$ is H, $CONR_{13}R_{14}$ or $SO_2NR_{13}R_{14}$;

$R_{11}$ and $R_{12}$ are each independently from all others benzyl or $C_1$-$C_{20}$alkyl which are unsubstituted or one or more times substituted by halogen, OH, O—$C_1$-$C_{20}$alkyl or CN; or $R_{12}$ is alternatively H;

each $R_{13}$ independently from any other $R_{13}$ is H or $R_{15}$;

$R_{14}$ and $R_{15}$ independently from one another, and each $R_{14}$ or $R_{15}$ independently from any other $R_{14}$ or $R_{15}$, are $C_1$-$C_{20}$alkyl, $C_3$-$C_{20}$cycloalkyl, $C_2$-$C_{20}$alkenyl, $C_2$-$C_{20}$alkynyl, $C_3$-$C_{20}$cycloalkenyl or $C_7$-$C_{20}$aralkyl which are each unsubstituted or one or more times substituted by halogen, hydroxy, amino, oxo, thio, $C_1$-$C_8$alkylamino, di($C_1$-$C_8$alkyl)amino, $C_1$-$C_8$alkoxy or $C_1$-$C_8$alkylthio; and when $R_{14}$ and $R_{15}$ comprise aliphatic chains, the aliphatic chains are uninterrupted or interrupted from 1 to $$\frac{n-2}{2}$$

times by O, S, NH or N($C_1$-$C_8$alkyl), n being the total number of aliphatic carbon atoms in $R_{14}$ and $R_{15}$; and $R_{14}$ and $R_{15}$ can optionally be linked together through an additional direct bond between them;

and two radicals of formula (I) can optionally be linked together via a direct bond or a group —O—, —S—, —$NR_{14}$—, —CO—, —$CO_2$—, —$CONR_{14}$— or —$CO_2$— connecting together each a substituent $R_1, R_2, R_3, R_4, R_5, R_6, R_7, R_8, R_9, R_{10}, R_{11}, R_{12}$ and $R_{14}$ from both radicals of formula (I).

Halogen is for example F, Cl, Br or J, preferably F on alkyl and Cl or Br on aryl.

$C_1$-$C_{20}$Alkyl is, for example, methyl, ethyl, n-propyl, isopropyl, n-butyl, sec-butyl, isobutyl, tert-butyl, 2-methyl-butyl, n-pentyl, 2-pentyl, 3-pentyl, 2,2-dimethylpropyl, n-hexyl, heptyl, n-octyl, 1,1,3,3-tetramethylbutyl, 2-ethylhexyl, nonyl, decyl, undecyl, dodecyl, tridecyl, tetradecyl, pentadecyl, hexadecyl, heptadecyl, octadecyl, nonadecyl or eicosyl.

$C_3$-$C_{20}$Cycloalkyl is, for example, cyclopropyl, cyclopropyl-methyl, cyclobutyl, cyclopentyl, cyclohexyl, cyclohexylmethyl, trimethylcyclohexyl, thujyl, norbornyl, bornyl, norcaryl, caryl, menthyl, norpinyl, pinyl, 1-adamantyl, 2-adamantyl, 5α-gonyl, 5ξ-pregnyl, (+)1,3,3-trimethylbicyclo[2.2.1]heptyl (fenchyl) or, where applicable, the optical antipodes thereof.

$C_2$-$C_{20}$Alkenyl is, for example, vinyl, allyl, 2-propen-2-yl, 2-buten-1-yl, 3-buten-1-yl, 1,3-butadien-2-yl, 2-penten-1-yl, 3-penten-2-yl, 2-methyl-1-buten-3-yl, 2-methyl-3-buten-2-yl, 3-methyl-2-buten-1-yl, 1,4-pentadien-3-yl, or any desired isomer of hexenyl, octenyl, nonenyl, decenyl, dodecenyl, tetradecenyl, hexadecenyl, octadecenyl, eicosenyl, heneicosenyl, docosenyl, tetracosenyl, hexadienyl, octadienyl, nonadienyl, decadienyl, dodecadienyl, tetradecadienyl, hexadecadienyl, octadecadienyl or eicosadienyl.

$C_3$-$C_{20}$Cycloalkenyl is, for example, 2-cyclobuten-1-yl, 2-cyclopenten-1-yl, 2-cyclohexen-1-yl, 3-cyclohexen-1-yl, 2,4-cyclohexadien-1-yl, 1-p-menthen-8-yl, 4(10)-thujen-10-yl, 2-norbornen-1-yl, 2,5-norbornadien-1-yl, 7,7-dimethyl-2,4-norcaradien-3-yl or camphenyl.

$C_1$-$C_{20}$Alkoxy is O—$C_1$-$C_{20}$alkyl, and $C_1$-$C_{20}$alkylthio is S—$C_1$-$C_{20}$alkyl.

$C_2$-$C_{20}$Alkynyl is, for example, 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl or 1-cosyn-20-yl.

$C_7$-$C_{20}$Aralkyl is, for example, benzyl, 2-benzyl-2-propyl, β-phenyl-ethyl, 9-fluorenyl, α,α-dimethylbenzyl, ω-phenyl-butyl, ω-phenyl-octyl, ω-phenyl-dodecyl or 3-methyl-5-(1',1',3',3'-tetramethyl-butyl)-benzyl. $C_7$-$C_{20}$Aralkyl can also be, for example, 2,4,6-tri-tert-butyl-benzyl. When $C_7$-$C_{20}$aralkyl is substituted, either the alkyl moiety or the aryl moiety of the aralkyl group can be substituted.

It will be easily understood that $$\frac{n-2}{2}$$

should always be considered as an integer only; when n is an odd number, the decimal fraction should be removed from $$\frac{n-2}{2}.$$

Preferably, $X_1$ and $X_2$ are O, $X_3$ is $NH_2$ and $R_6$, $R_9$ and $R_{10}$ are all H. $R_1$, $R_2$, $R_4$, $R_5$ and $R_7$ are preferably each independently from all others H, benzyl or $C_1$-$C_{12}$alkyl which are unsubstituted or one or more times substituted by halogen, whereby preferably at least 4 of $R_1$, $R_2$, $R_4$, $R_5$ and $R_7$ are benzyl or $C_1$-$C_{12}$alkyl, especially benzyl or unsubstituted $C_1$-$C_{12}$alkyl.

Independently of or in combination with above preferences, preferably $R_2$ is H, $SO_2NR_{13}R_{14}$, or is benzyl or $C_1$-$C_{12}$alkyl which are unsubstituted or one or more times substituted by halogen, and $R_8$ is $SO_2NR_{13}R_{14}$. $SO_2NR_{13}R_{14}$ is also preferred to $CONR_{13}R_{14}$ as a substituting group at any other position of the 1,4-diamino-anthraquinone dye or 1,9-annellated derivative thereof, even independently from formula (I).

Preferably, $R_{11}$ is $C_1$-$C_{12}$alkyl and $R_{12}$ is H, benzyl or $C_1$-$C_{12}$alkyl, especially H.

$R_{14}$ and $R_{15}$ are preferably independently from each other $C_1$-$C_{20}$alkyl, $C_3$-$C_{20}$-cycloalkyl, or $C_7$-$C_{20}$aralkyl which are each unsubstituted or one or more times substituted by hydroxy, $C_1$-$C_8$alkoxy, amino, $C_1$-$C_8$alkylamino or di($C_1$-$C_8$alkyl)-amino, any aliphatic chains if present being uninterrupted or from 1 to $$\frac{n-2}{2}$$

times interrupted by O, NH or N($C_1$-$C_8$alkyl), such as in optionally terminally N- or O-alkylated poly-$C_2$-$C_3$alkylene-amino or poly-$C_2$-$C_3$alkylene-oxy groups.

The 1,4-diamino-anthraquinone dye or 1,9-annellated derivative thereof of formula (I) can be used for colour filters in combination with copper phthalocyanine, especially α copper phthalocyanine or ε copper phthalocyanine, as well as in combination with customary other colorants (dyes or pigments), or also as the only colorant.

Accordingly, the invention also pertains to a colour filter comprising a transparent substrate and one layer or multiple layers thereon, at least one layer comprising a 1,4-diamino-anthraquinone dye or 1,9-annellated derivative thereof of formula (I).

The 1,4-diamino-anthraquinone dye or 1,9-annellated derivative thereof is most preferably of formula

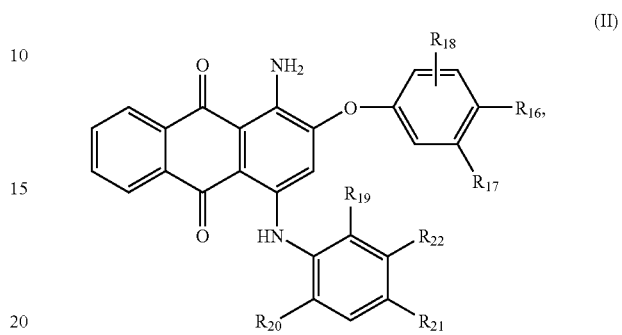

(II)

wherein $R_{16}$ is halogen, phenyl, benzyl or $C_1$-$C_8$alkyl and $R_{17}$ is H, $R_{16}$ is H and $R_{17}$ is $C_1$-$C_8$alkyl, or $R_{16}$ and $R_{17}$ are both H; $R_{18}$ is H, halogen, $C_1$-$C_8$alkyl or $SO_2NR_{13}R_{14}$; $R_{19}$, $R_{20}$ and $R_{21}$ are each independently from the others halogen or $C_1$-$C_8$alkyl; and $R_{22}$ is H or, if applicable independently from $R_{18}$, $SO_2NR_{13}R_{14}$.

In formula (II), preferably $R_{18}$ is H or $SO_2NR_{13}R_{14}$; and $R_{22}$ is H or independently from $R_{18}$ $SO_2NR_{13}R_{14}$. These new compounds are also an object of the invention. They can be easily prepared by any methods which are known per se, for example in analogy to the methods disclosed in U.S. Pat. No. 4,403,092.

The sulfonamides are for example adequately prepared by sulfochlorination and reaction of the sulfochloride with an amine $NR_{13}R_{14}$. At lower temperature, the sulfochlorination generally leads to sulfochloride substituents at positions $R_8$ or $R_{22}$, upon gentle heating also at positions $R_2$ or $R_{18}$. At higher temperature, however, the sulfochlorination step leads to the partial cleavage of certain carbon substituents $R_1$ or $R_{16}$, such as alkyl or benzyl, especially branched alkyl, such as tert-butyl. This position may then also get sulfochlorinated then further converted to the sulfonamide. Hence, when $R_1$ is H in formula (I), the $R_2$ substituent can also take this position para to $X_1$, and when $R_{16}$ is H in formula (II), the $R_{18}$ substituent can also take this position para to O:

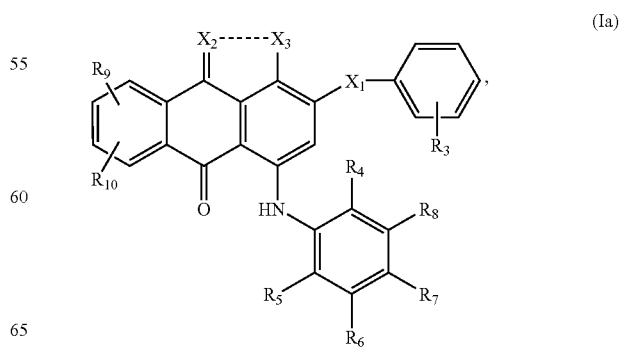

(Ia)

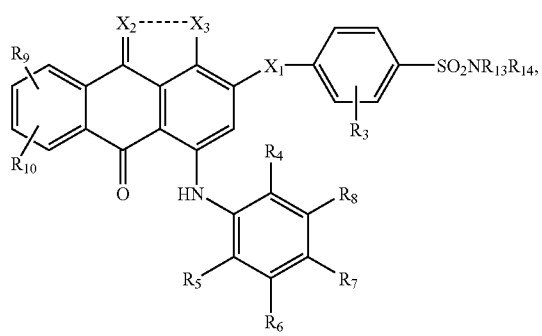

(Ib)

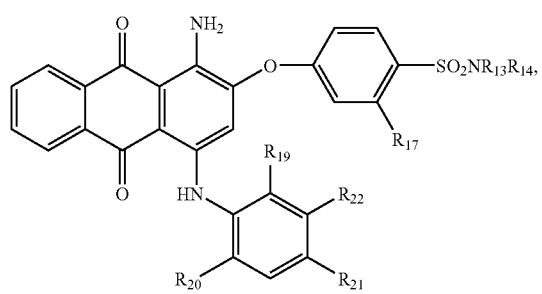

and (IIa)

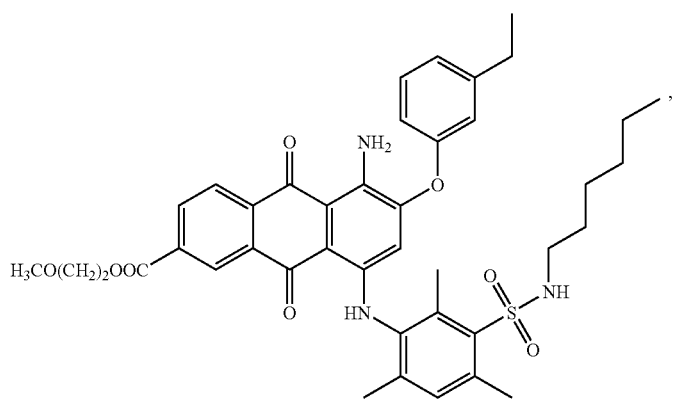

(IIb)

respectively.

Thus, it is easy to optimize the reaction conditions in order to obtain the desired products or product mixtures, mainly by choosing an adequate temperature for the sulfochlorination step. Product mixtures have often advantages, such as a better solubility or a lower tendency to aggregate.

Hence, the invention also pertains to a compound of formula

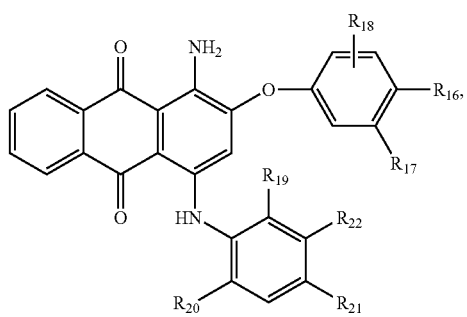

(II)

wherein $R_{16}$ is halogen, phenyl, benzyl or $C_1$-$C_8$alkyl and $R_{17}$ is H, $R_{16}$ is H and $R_{17}$ is $C_1$-$C_8$alkyl, or $R_{16}$ and $R_{17}$ are both H; $R_{18}$ is H, halogen, $C_1$-$C_8$alkyl or $SO_2NR_{13}R_{14}$; $R_{19}$, $R_{20}$ and $R_{21}$ are each independently from the others halogen or $C_1$-$C_8$alkyl; and $R_{22}$ is independently from $R_{18}$ $SO_2NR_{13}R_{14}$, with the proviso that at least one of $R_{18}$ and $R_{22}$ is $SO_2NR_{13}R_{14}$, and two radicals of formula (II) can optionally be linked together via a direct bond or a group —O—, —S—, —NR$_{14}$—, —CO—, —CO$_2$—, —CONR$_{14}$— or —CO$_2$— connecting together each a substituent $R_{16}$, $R_{17}$, $R_{18}$, $R_{19}$, $R_{20}$, $R_{21}$ and $R_{11}$ from both radicals of formula (II). $R_{16}$ is preferably benzyl or $C_1$-$C_8$alkyl, especially $C_1$-$C_8$alkyl.

Examples of compounds of formula (II), to which the invention is however not at all limited, are:

-continued
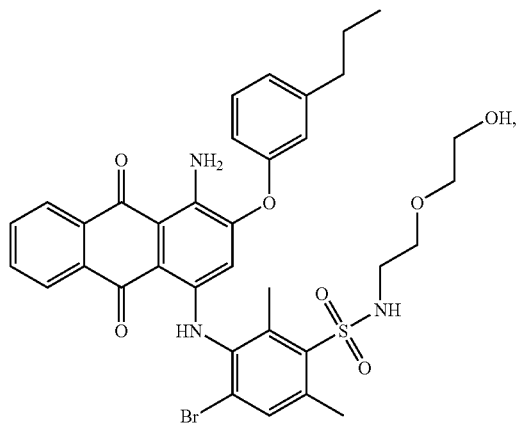
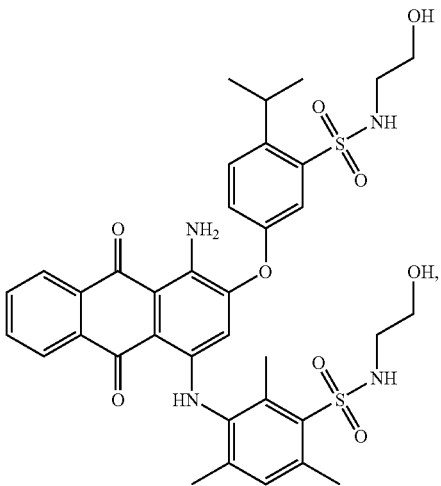
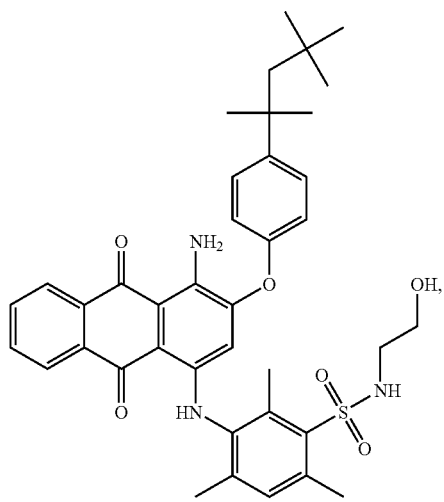
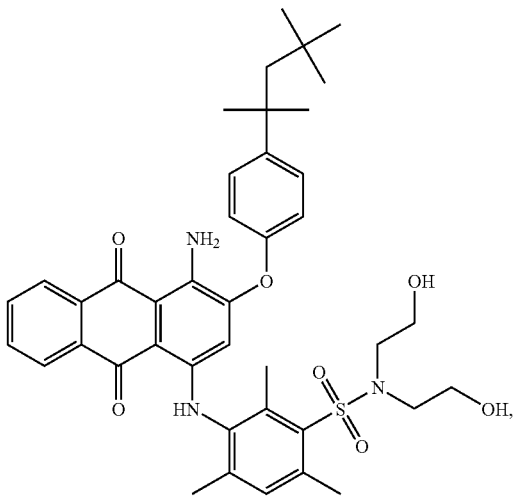
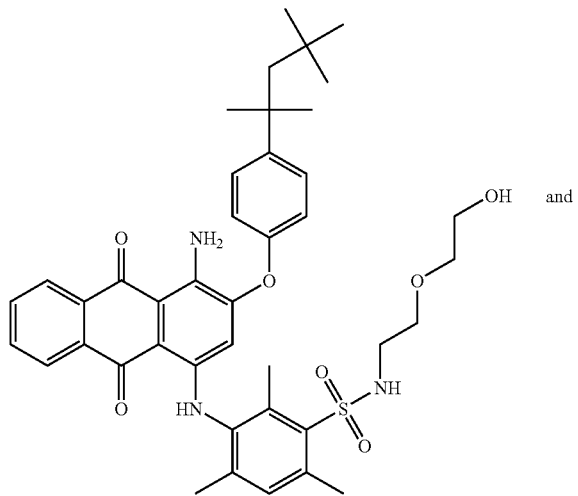
and

-continued

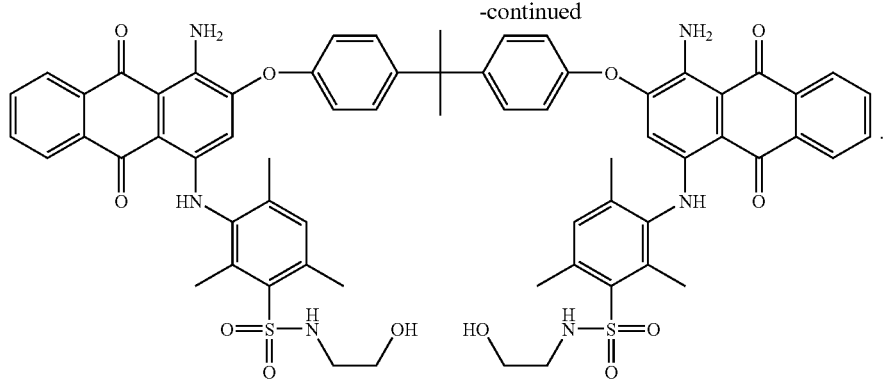

The compounds of formulae (I) and preferably (II) can also be used for any known coloring purpose, such as for example as solvent or disperse dyes on textiles, paper or other materials, or as colorants in printing inks, plastics and coatings.

A preferred application is the use of a compound of formula (I), preferably of formula (II), for enhancing or modifying the colour of high molecular weight organic materials comprising pigments.

High molecular weight organic materials are of natural or synthetic origin (e.g. polymers) and have usually a molecular weight usually in the range from $10^3$ to $10^8$ g/mol. They can be in the form of fibers, surface-coating compositions (including special-effect finishes, including those for the automotive sector) and printing inks, or preferably also in so-called resists (for example for colour filters) or as toners. Such uses will be so obvious to the person skilled in the art that it is possible to dispense with listing them here. They are also disclosed in numerous patent specifications and technical works, for example "Industrielle Organische Pigmente" (W. Herbst+K. Hunger, VCH Weinheim/New York, new editions continually published in German and English).

The total amount of colorants, including the compounds of formulae (I) and (II) as well as the pigments, is adequately from 0.01 to 70% by weight, based on the total weight of colorants and high molecular weight organic material. The weight ratio of compounds of formulae (I) and (II) to pigments in the colored high molecular weight organic material is suitably from 0.001 to 99, preferably from 0.01 to 10.

Pigments useful in combination with compounds of formulae (I) and (II) are, for example, Colour Index Pigment Yellow 3, 12, 13, 14, 17, 24, 34, 42, 53, 62, 74, 83, 93, 95, 108, 109, 110, 111, 119, 123, 128, 129, 139, 147, 150, 164, 168, 173, 174, 184, 188, 191, 191:1, 191:2, 193, 199, Pigment Orange 5, 13, 16, 34, 40, 43, 48, 49, 51, 61, 64, 71, 73, Pigment Red 2, 4, 5, 23, 48:1, 48:2, 48:3, 48:4, 52:2, 53:1, 57, 57:1, 88, 89, 101, 104, 112, 122, 144, 146, 149, 166, 168, 177, 178, 179, 181, 184, 190, 192, 194, 202, 204, 206, 207, 209, 214, 216, 220, 221, 222, 224, 226, 254, 255, 262, 264, 270, 272, 282, 283, Pigment Brown 23, 24, 33, 42, 43, 44, Pigment Violet 19, 23, 29, 31, 37, 42, Pigment Blue 15, 15:1, 15:2, 15:3, 15:4, 15:6, 16, 28, 29, 60, 64, 66, Pigment Green 7, 17, 36, 37, 50, Pigment White 6, Pigment Black 7, 12, 27, 30, 31, 32, Vat Red 74, 3,6-di(3'-cyano-phenyl)-2,5-dihydro-pyrrolo[3,4-c]pyrrole-1,4-dione or 3-phenyl-6-(4'-tert-butyl-phenyl)-2,5-dihydro-pyrrolo[3,4-c]pyrrole-1,4-dione.

The invention further pertains to a composition comprising from 0.1 to 70% by weight of α copper phthalocyanine or ε copper phthalocyanine, from 0.1 to 100% by weight, based on the weight of the copper phthalocyanine, of a 1,4-diamino-anthraquinone dye or 1,9-annellated derivative thereof, of which the most bathochromic dichloromethane solution absorption peak in the visible spectrum is at from 575 to 615 nm, preferably at from 585 to 605 nm, and a liquid medium comprising a binder or a polymerisable compound.

The invention still further also pertains to a colour filter comprising a transparent substrate and one layer or multiple layers thereon, at least one layer (i) comprising a 1,4-diamino-anthraquinone dye or 1,9-annellated derivative thereof, of which the most bathochromic dichloromethane solution absorption peak in the visible spectrum is at from 575 to 615 nm, preferably at from 585 to 605 nm, and layer (i) or a different layer (ii) comprises an α copper phthalocyanine or ε copper phthalocyanine pigment.

The 1,4-diamino-anthraquinone dye or 1,9-annellated derivative thereof and the α copper phthalocyanine or ε copper phthalocyanine are preferably comprised in the same layer (i). However, it is also possible the 1,4-diamino-anthraquinone dye or 1,9-annellated derivative thereof and the α copper phthalocyanine or ε copper phthalocyanine to be in two different layers, preferably adjacent layers. If the colour filter has a patterned structure, then it is most suitable layer (i) and layer (ii) to exhibit the same pattern, so that their colored areas match the same pixels.

The number of layers in a multi-layered structure is irrelevant for the purpose of the invention. Generally, a multi-layered structure comprises from 2 to 25 layers, especially from 3 to 10 layers, on the substrate. The layers may be patterned, especially in the case of colored, black or electrically switchable layers, or uniform, especially in the case of optional intermediate and/or protective layers. The structure of colour filters of different types, in all of which the instant invention is suitable, is well-known in the art.

Preferably, as described above, the amount of copper phthalocyanine is from 1 to 75% by weight, based on the weight of the layer in which it is comprised, and the amount of the 1,4-diamino-anthraquinone dye or 1,9-annellated derivative thereof in the same layer is from 0.1 to 100% by weight, based on the weight of the copper phthalocyanine.

The invention finally pertains to a process for manufacturing a colour filter, wherein a composition comprising from 0.1 to 70% by weight of α copper phthalocyanine or ε copper phthalocyanine, from 0.1 to 100% by weight, based on the weight of the copper phthalocyanine, of a 1,4-diamino-anthraquinone dye or 1,9-annellated derivative thereof, of which the most bathochromic dichloromethane solution absorption peak in the visible spectrum is at from 575 to 615 nm, preferably at from 585 to 605 nm, and a liquid medium comprising a binder or a polymerisable compound is applied onto a transparent substrate optionally comprising patterned or not patterned layers thereon, and the composition is dried and/or cured to give a patterned or not patterned layer.

The drying, patterning and curing processes are well-known in the art, but are nevertheless described below in more detail for illustration purpose.

The invention in particular also pertains to the use of the instant pigments in colour filters, which can themselves be used for example in electro-optical systems such as TV screens, computer screens, portable telephone screens, navigation systems, CCD cameras, liquid crystal displays, flat panel displays, charge coupled devices, plasma displays or electroluminescent displays and the like. These may be, for example, active (twisted nematic) or passive (supertwisted nematic) ferroelectric displays or light-emitting diodes.

The colour filters manufactured according to the invention exhibit outstanding hue, light stability, transparency and contrast.

The colorants of the invention will generally be used in the manufacture of colour filters as a solution or dispersion in an organic solvent or water. There are several ways to manufacture these colour filters, which follow two mainstreams:

Direct patterning during applying;
Patterning after applying the colorant.

Direct patterning can be obtained by several printing techniques, such as impact (off-set, flexography, stamping, letterpress etc.) as well as non-impact (ink jet techniques).

Other direct patterning techniques are based on lamination processes, electronic discharging processes like electrodeposition and some special colour proofing methods, like the so-called Chromalin™ process (DuPont).

For impact printing techniques, colorants may be dissolved or dispersed in water or organic solvents by standard de-agglomeration methods (Skandex, Dynomill, Dispermat and the like) in the presence of a dispersant and a polymeric binder to produce an ink. Any dispersion technique known in the field, including the choice of solvent, dispersant and binder, can be used. The type of ink and its viscosity depend on the application technique and are well-known to the skilled artisan. Most usual binders, to which the invention is of course not limited, are (meth)acrylates, epoxies, PVA, polyimids, Novolak systems and the like as well as combinations of these polymers.

The ink dispersion then can be printed on all kind of standard printing machines. Curing of the binder system is preferably achieved by a heating process. The three colors can be applied at once or in different printing steps with intermediate drying and/or curing steps, for example one colour at a time in three printing steps.

Inks for use in ink jet, for example piezo or bubble jet, can be prepared likewise. They generally contain a colorant dissolved or dispersed in water and/or one or a mixture of many hydrophilic organic solvents in combination with a dispersant and a binder.

For ink jet printing, a standard ink jet printer can be used or a dedicated printer can be built in order to optimize for example the printing speed etc.

For lamination techniques, like thermal transfer and the like, a web system has to be made: the colorant is dispersed in a solvent or water with dispersant and binder and coated on a foil and dried. The colorant/binder system can be patternwise or uniformly transferred to a colour filter substrate with the help of energy (UV, IR, heat, pressure etc.). Depending on the technique used, the colorant for example may be transferred alone (dye diffusion or sublimation transfer), or the colorant dispersion may be entirely transferred including the binder (wax transfer).

For electrodeposition, the colorant has to be dispersed in water together with an ionized polymer. By means of an electrical current, the ionized polymer is deionized at the anode or the cathode and, being insoluble then, deposited together with the pigments. This can be done on patterned or patternwise shielded, by a photoresist, (transparent) photoconductors like ITO etc.

The Chromelin™ process makes use of a photosensitive material, deposited on a colour filter substrate. The material becomes tacky upon UV exposure. The so called 'toner', comprising a mixture or compound of colorant and polymer, is distributed on the substrate and sticks on the tacky parts. This process has to be done three to four times for R, G, B and eventually black.

Patterning after applying is a method based mostly on the known photoresist technology, wherein the colorant is dispersed in the photoresist composition. Other methods are indirect patterning with the help of a separate photoresist or lamination techniques.

The colorant may be dissolved or dispersed into photoresists by any standard method such as described above for the printing processes. The binder systems may also be identical. Further suitable compositions are described for example in EP 0654711, WO 98/45756 or WO 98/45757.

Photoresists comprise a photoinitiator and a polycrosslinkable monomer (negative radical polymerization), a material to crosslink the polymers itself (for example a photoacid generator or the like) or a material to chemically change the solubility of the polymer in certain developing media. This process, however, can also be done with heat (for example using thermal arrays or a NIR beam) instead of UV, in the case of some polymers which undergo chemical changes upon heating, resulting in changes of solubility in the mentioned developing media. A photoinitiator is then not needed.

The photosensitive or heat sensible material is coated on a colour filter substrate, dried and UV (or heat) irradiated, sometimes again baked (photoacid generators) and developed with a developing medium (mostly a base). In this last step only the non-exposed (negative systems) or only the exposed (positive systems) parts are washed away, giving the wanted pattern. This operation has to be repeated for all the colors used.

Photosensitive lamination techniques are using the same principle, the only difference being the coating technique. A photosensitive system is applied as described above, however on a web instead of a colour filter substrate. The foil is placed on the colour filter substrate and the photosensitive layer is transferred with the help of heat and/or pressure.

Indirect processes, with the above mentioned polymeric binders without a photosensitive component, make use of an extra photoresist, coated on top of the pigmented resist. During the patterning of the photoresist, the colored resist is patterned as well. The photoresist has to be removed afterwards.

More details about the manufacture of colour filters can be found in text books, reviews and other scientific articles. The skilled artisan will associate the instant invention with the use of any such known technique as well.

For example, which is of course in no way limitative, substantially colorless methacrylic resin are commonly used in colour filters, examples thereof which are known to the skilled artisan being copolymers of aromatic methacrylates with methacrylic acid of $M_w$ from 30'000 to 60'000. Such resins are highly appropriated to make films by spin-coating.

The colour filters of the invention contain the colorant compositions of the invention judiciously in a concentration of from 1 to 75% by weight, preferably from 5 to 50% by weight, with particular preference from 25 to 40% by weight, based on the overall weight of the layer comprising said colorant.

The invention therefore likewise provides a colour filter comprising a transparent substrate and a layer comprising from 1 to 75% by weight, preferably from 5 to 50% by weight, with particular preference from 25 to 40% by weight, based on the overall weight of the layer comprising said colorant, of a colorant composition of the invention or the individual components of said composition dispersed in a high molecular mass organic material. The substrate is preferably essentially colorless (T≧95% all over the visible range from 400 to 700 nm).

The instant printing inks or photoresists for making colour filters contain the colorant or colorant compositions of the invention judiciously in a concentration of from 0.01 to 40% by weight, preferably from 1 to 25% by weight, with particular preference from 5 to 10% by weight, based on the overall weight of the printing ink or photoresist.

The invention therefore likewise provides a composition for making colour filters comprising from 0.01 to 40% by weight, preferably from 1 to 25% by weight, with particular preference from 5 to 10% by weight, based on the overall weight of the composition, of a colorant or colorant composition of the invention dispersed therein.

This colorant composition also may additionally contain other colorants of different structure. The additional components will shift the mixture's spectrum hypsochromically or bathochromically depending on their own hue. The skilled artisan will appreciate by himself which colorants can additionally be used, and in which amounts, depending on the desired colour.

In certain cases, it is advantageous to use the inventive compositions in mixture or in combination with other additives such as wetting agents, surfactants, defoamers, antioxidants, UV absorbers, light stabilizers, plastisizers, or general texture improving agents and so forth. Generally such additives can be used in a concentration from about 0.1 to 25 percent, preferably from about 0.2 to 15% and most preferably from about 0.5 to 8%, by weight based on the total weight of (a), (b) and (c).

Surfactants are generally used to disperse insoluble components, such as the copper phthalocyanine pigments. They may also be used for example with instant 1,4-diamino-anthraquinone dyes or 1,9-annellated derivatives thereof of low solubility; however, when the whole colorant is totally dissolved, it is generally judicious not to use surfactants, as this might lead to scattering and to a lower contrast. Cationic, anionic, amphoteric, zwitterionic or neutral nonionic surfactants are very well known to the person skilled in the art. Suitable surfactants include for example anionic surfactants such as alkylbenzene- or alkylnaphthalene-sulfonates, alkylsulfosuccinates or naphthalene formaldehyde sulfonates; cationic surfactants including, for example, quaternary salts such as benzyl tributyl ammonium chloride; or nonionic or amphoteric surfactants such as polyoxyethylene surfactants and alkyl- or amidopropyl betaines, respectively. Most preferred surfactant, which leads to excellent colorant dispersions and especially highly transparent colour filters, is EFKA® 3440 (CIBA Specialty Chemicals Inc.).

Suitable texture improving agents are, for example, fatty acids such as stearic acid or behenic acid, and fatty amines such as laurylamine and stearylamine. In addition, fatty alcohols or ethoxylated fatty alcohols, polyols such as aliphatic 1,2-diols or epoxidized soy bean oil, waxes, resin acids and resin acid salts may be used for this purpose.

Suitable UV stabilizers are, for example, the known benzotriazole derivatives known under the trade name TINUVIN® or CIBA® Fast H Liquid an aryl sulfonated benzotriazol, both being products of CIBA Specialty Chemicals Inc.

The skilled artisan will obviously recognize that there are many other possible applications in all fields where colorants are used, such as inks, coatings and polymers. The instant colorant or colorant compositions will prove particularly useful alone or in combination with fine or transparent pigments. Where ever the thermal colour stability is an issue, it is worth to try resolving it by using the instant compositions, with a reasonable expectation of much better results to be obtained. Typical examples are coil- and powder coatings, extruded or injection molded engineering plastics as well as melt-spun fibers, this list self-evidently not being exhaustive.

The materials used for manufacturing colour filters according to above-mentioned and other processes are well-known in the art.

For example, a binder may be used which is alkali-soluble, preferably a linear organic polymer that is soluble in an organic solvent and developable with a weak alkali aqueous solution. As such binder used in a colour filter resist composition, which is soluble in an alkaline aqueous solution and insoluble in water, for example, a homopolymer of a polymerizable compound having one or more acid groups and one or more polymerizable unsaturated bonds in the molecule, or a copolymer of two or more kinds thereof, and a copolymer of one or more polymerizable compounds having one or more unsaturated bonds copolymerizable with these compounds and containing no acid group, can be used. Such compounds can be obtained by copolymerizing one or more kinds of a low molecular compound having one or more acid groups and one or more polymerizable unsaturated bonds in the molecule with one or more polymerizable compounds having one or more unsaturated bonds copolymerizable with these compounds and containing no acid group. Examples of acids groups are a —COOH group, a —SO$_2$NHCO— group, a —SO$_3$H group, a phenolic hydroxy group, a —SO$_2$NH— group, and a —CO—NH—CO— group. Among those, a high molecular compound having a —COOH group is particularly preferred.

Preferably, the organic polymer binder in the colour filter resist composition comprises an alkali soluble copolymer comprising, as addition polymerizable monomer units, at least an unsaturated organic acid compound such as acrylic acid, methacrylic acid and the like. It is preferred to use as a further co-monomer for the polymer binder an unsaturated organic acid ester compound such as methyl acrylate, ethyl (meth)acrylate, benzyl(meth)acrylate, styrene and the like to balance properties such as alkaline solubility, adhesion rigidity, chemical resistance etc.

The organic polymer binder can for example be either a random copolymer or a block copolymer, such as described in U.S. Pat. No. 5,368,976.

Polymerizable compounds suitable for the preparation of colour filters according to the invention, are also well-known in the art. They may for example have one or more acid group and one or more polymerizable unsaturated bond in the molecule.

Examples of the polymerizable compounds having one or more —COOH groups and one or more polymerizable unsaturated bonds in a molecule are (meth)acrylic acid, 2-carboxyethyl(meth)acrylic acid, 2-carboxypropyl(meth)acrylic acid, crotonic acid, cinnamic acid, mono[2-(meth)acryloyloxyethyl]succinate, mono[2-(meth)acryloyl-oxyethyl]adipate, mono[2-(meth)acryloyloxyethyl]phthalate, mono[2-(meth)acryloyloxyethyl]hexahydrophthalate, mono[2-(meth)acryloyloxyethyl]maleate, mono-[2-(meth)acryloyloxypropyl] succinate, mono[2-(meth)acryloyloxypropyl]adipate, mono [2-(meth)acryloyloxypropyl]phthalate, mono[2-(meth)acryloyloxypropyl]hexahydrophthalate, mono[2-(meth)acryloyloxypropyl]maleate, mono[2-(meth)-acryloyloxybutyl]succinate, mono[2-(meth)acryloyloxybutyl]adipate, mono-[2-(meth)acryloyloxybutyl]phthalate, mono[2-(meth)acryloyloxybutyl]hexahydrophthalate, mono[2-(meth)acryloyloxybutyl]maleate, 3-(alkylcarbamoyl)acrylic acid, α-chloroacrylic acid, maleic acid, monoesterified maleic acid, fumaric acid, itaconic acid, citraconic acid, mesaconic acid, maleic anhydride, and ω-carboxypolycaprolactone mono(meth)acrylate.

Vinylbenzenesulfonic acid and 2-(meth)acrylamide-2-methylpropanesulfonic acid are examples of the polymerizable compounds having one or more —$SO_3H$ groups and one or more polymerizable unsaturated bonds.

N-methylsulfonyl(meth)acrylamide, N-ethylsulfonyl (meth)acrylamide, N-phenyl-sulfonyl (meth)acrylamide, and N-(p-methylphenylsulfonyl) (meth)acrylamide are examples of the polymerizable compounds having one or more —$SO_2NHCO$— groups and one or more polymerizable unsaturated bonds.

Examples of polymerizable compounds having one or more phenolic hydroxy groups and one or more polymerizable unsaturated bonds in a molecule include hydroxyphenyl (meth)acrylamide, dihydroxyphenyl(meth)acrylamide, hydroxy-phenyl-carbonyloxyethyl (meth)acrylate, hydroxyphenyloxyethyl(meth)acrylate, hydroxyphenylthioethyl (meth)acrylate, dihydroxyphenylcarbonyloxyethyl(meth)-acrylate, dihydroxyphenyloxyethyl(meth)acrylate, and dihydroxy-phenylthioethyl (meth)acrylate.

Examples of the polymerizable compound having one or more —$SO_2NH$— groups and one or more polymerizable unsaturated bonds in the molecule include compounds represented by formula (a) or (b):

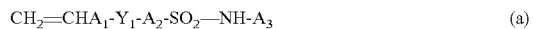  (a)

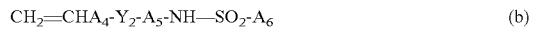  (b)

wherein $Y_1$ and $Y_2$ each represents —COO—, —$CONA_7$-, or a single bond; $A_1$ and $A_4$ each represents H or $CH_3$; $A_2$ and $A_5$ each represents $C_1$-$C_{12}$alkylene optionally having a substituent, cycloalkylene, arylene, or aralkylene, or $C_2$-$C_{12}$alkylene into which an ether group and a thioether group are inserted, cycloalkylene, arylene, or aralkylene; $A_3$ and $A_6$ each represents H, $C_1$-$C_{12}$alkyl optionally having a substituent, a cycloalkyl group, an aryl group, or an aralkyl group; and $A_7$ represents H, $C_1$-$C_{12}$alkyl optionally having a substituent, a cycloalkyl group, an aryl group, or an aralkyl group.

The polymerizable compounds having one or more —CO—NH—CO— group and one or more polymerizable unsaturated bond include maleimide and N-acryloyl-acrylamide. These polymerizable compounds become the high molecular compounds comprising a —CO—NH—CO— group, in which a ring is formed together with a primary chain by polymerization. Further, a methacrylic acid derivative and an acrylic acid derivative each having a —CO—NH—CO— group can be used as well. Such methacrylic acid derivatives and the acrylic acid derivatives include, for example, a methacryl-amide derivative such as N-acetylmethacrylamide, N-propionylmethacrylamide, N-butanoylmethacrylamide, N-pentanoylmethacrylamide, N-decanoylmethacrylamide, N-dodecanoylmethacrylamide, N-benzoylmethacrylamide, N-(p-methylbenzoyl)methacryl-amide, N-(p-chlorobenzoyl) methacrylamide, N-(naphthyl-carbonyl)-methacrylamide, N-(phenylacetyl)-methacryl-amide, and 4-methacryloy-lamino-phthalimide, and an acrylamide derivative having the same substituent as these. These polymerizable compounds polymerize to be compounds having a —CO—NH—CO— group in a side chain.

Examples of polymerizable compounds having one or more polymerizable unsaturated bond and containing no acid group include a compound having a polymerizable unsaturated bond, selected from esters of (meth)acrylic acid, such as methyl(meth)acrylate, ethyl(meth)acrylate, propyl(meth) acrylate, butyl(meth)-acrylate, tetrahydrofurfuryl(meth) acrylate, benzyl(meth)acrylate, 2-ethylhexyl (meth)acrylate, hydroxyethyl(meth)acrylate, hydroxypropyl(meth)acrylate, hydroxybutyl(meth)acrylate, glycerol mono(meth)acrylate, dihydroxypropyl(meth)-acrylate, allyl(meth)acrylate, cyclohexyl(meth)acrylate, phenyl(meth)acrylate, methoxyphenyl (meth)acrylate, methoxyethyl(meth)acrylate, phenoxyethyl (meth)-acrylate, methoxydiethyleneglycol(meth)acrylate, methoxytriethyleneglycol(meth)-acrylate, methoxypropyl (meth)acrylate, methoxydipropyleneglycol(meth)acrylate, isobornyl meth(acrylate), dicyclopentadienyl(meth)acrylate, 2-hydroxy-3-phenoxy-propyl (meth)acrylate, tricyclo $[5.2.1.0^{2,6}]$decan-8-yl(meth)acrylate, aminoethyl (meth) acrylate, N,N-dimethylaminoethyl(meth)acrylate, aminopropyl(meth)acrylate, N,N-dimethylaminopropyl(meth) acrylate, glycidyl(meth)acrylate, 2-methyl-glycidyl (meth) acrylate, 3,4-epoxybutyl(meth)acrylate, 6,7-epoxyheptyl (meth)-acrylate; vinyl aromatic compounds, such as styrene, α-methylstyrene, vinyl-toluene, p-chlorostyrene, polychlorostyrene, fluorostyrene, bromostyrene, ethoxymethyl styrene, methoxystyrene, 4-methoxy-3-methylstyrene, dimethoxy-styrene, vinylbenzyl methyl ether, vinylbenzyl glycidyl ether, indene, 1-methyl-indene; vinyl or allyl esters, such as vinyl acetate, vinyl propionate, vinyl butylate, vinyl pivalate, vinyl benzoate, vinyl trimethylacetate, vinyl diethylacetate, vinyl borate, vinyl caproate, vinyl chloroacetate, vinyl dichloroacetate, vinyl methoxy-acetate, vinyl butoxyacetate, vinyl phenylacetate, vinyl acetate, vinyl acetoacetate, vinyl lactate, vinyl phenylbutylate, vinyl cyclohexylcarboxylate, vinyl salicylate, vinyl chlorobenzoate, vinyl tetrachlorobenzoate, vinyl naphthoate, allyl acetate, allyl propionate, allyl butylate, allyl pivalate, allyl benzoate, allyl caproate, allyl stearate, allyl acetoacetate, allyl lactate; vinyl or allyl ethers, such as vinyl methyl ether, vinyl ethyl ether, vinyl hexyl ether, vinyl octyl ether, vinyl ethylhexyl ether, vinyl methoxy-ethyl ether, vinyl ethoxyethyl ether, vinyl chloroethyl ether, vinyl hydroxyethyl ether, vinyl ethylbutyl ether, vinyl hydroxyethoxyethyl ether, vinyl dimethylaminoethyl ether, vinyl diethylaminoethyl ether, vinyl butylaminoethyl ether, vinyl benzyl ether, vinyl tetrahydrofurfuryl ether, vinyl phenyl ether, vinyl tolyl ether, vinyl chlorophenyl ether, vinyl chloroethyl ether, vinyl dichlorophenyl ether, vinyl naphthyl ether, vinyl anthryl ether, allyl glycidyl ether; amide type unsaturated compounds, such as (meth)acrylamide, N,N-dimethyl(meth)acrylamide, N,N-diethyl(meth)acrylamide, N,N-dibutyl(meth)acrylamide, N,N-diethylhexyl(meth) acrylamide, N,N-dicyclo-hexyl (meth)acrylamide, N,N-diphenyl(meth)acrylamide, N-methyl-N-phenyl (meth)acrylamide, N-hydroxyethyl-N-methyl(meth)acrylamide, N-methyl(meth)-acrylamide, N-ethyl(meth)acrylamide, N-propyl(meth)acrylamide, N-butyl(meth)-acrylamide, N-hydroxyethyl(meth)acrylamide, N-heptyl(meth)acrylamide, N-octyl(meth)acrylamide, N-ethyhexyl(meth)acrylamide, N-hydroxyethyl(meth)acryl-amidecyclohexyl, N-benzyl(meth)acrylamide, N-phenyl(meth)acrylamide, N-tolyl (meth)acrylamide, N-hydroxyphenyl(meth)acrylamide, N-naphthyl(meth)acryl-amide, N-phenylsulfonyl(meth) acrylamide, N-methylphenylsulfonyl(meth)acryl-amide and N-(meth)acryloylmorpholine, diacetone acrylamide, N-methylol acryl-amide, N-butoxyacrylamide; polyolefin type compounds, such as butadiene, isoprene, chloroprene and the like; (meth)acrylonitrile, methyl isopropenyl ketone, maleimide, N-phenylmaleimide, N-methylphenylmaleimide, N-methoxyphenyl-maleimide, N-cyclohexylmaleimide, N-alkylmaleimide, maleic anhydride, poly-styrene macromonomer, polymethyl(meth)acrylate macromonomer, polybutyl(meth)acrylate macromonomer; crotonates, such as butyl crotonate, hexyl crotonate, glycerine monocrotonate; and itaconates, such as dimethyl itaconate, diethyl itaconate, dibutyl itaconate; and maleates or fumarates, such as dimethyl maleate, dibutyl fumarate.

Preferable examples of copolymers are copolymers of methyl(meth)acrylate and (meth)acrylic acid, copolymers of benzyl(meth)acrylate and (meth)acrylic acid, copolymers of methyl(meth)acrylate/, ethyl(meth)acrylate and (meth)acrylic acid, copolymers of benzyl(meth)acrylate, (meth)acrylic acid and styrene, copolymers of benzyl(meth)acrylate, (meth)acrylic acid and 2-hydroxyethyl(meth)acrylate, copolymers of methyl(meth)acrylate/, butyl(meth)acrylate, (meth)acrylic acid and styrene, copolymers of methyl(meth)acrylate, benzyl(meth)acrylate, (metha)crylic acid and hydroxyphenyl(meth)acrylate, copolymers of methyl(meth)acrylate, (metha)crylic acid and polymethyl(meth)acrylate macromonomer, copolymers of benzyl(meth)crylate, (metha)crylic acid and polymethyl(meth)acrylate macromonomer, copolymers of tetrahydrofurfuryl(meth)acrylate, styrene and (meth)acrylic acid, copolymers of methyl(meth)acrylate, (meth)acrylic acid and polystyrene macromonomer, copolymers of benzyl(meth)acrylate, (meth)acrylic acid and polystyrene macromonomer, copolymers of benzyl(meth)acrylate, (meth)acrylic acid, 2-hydroxyethyl(meth)acrylate and polystyrene macromonomer, copolymers of benzyl(meth)acrylate, (meth)acrylic acid, 2-hydroxypropyl (meth)acrylate and polystyrene macromonomer, copolymers of benzyl (meth)acrylate, (meth)acrylic acid, 2-hydroxy-3-phenoxypropyl(meth)acrylate and polymethyl (meth)acrylate macromonomer, copolymers of methyl(meth)acrylate, (meth)acrylic acid, 2-hydroxyethyl(meth)acrylate and polystyrene macromonomer, copolymers of benzyl(meth)acrylate, (metha)crylic acid, 2-hydroxyethyl(meth)acrylate and polymethyl(meth)acrylate macromonomer, copolymers of N-phenylmaleimide, benzyl (meth)acrylate, (metha)crylic acid and styrene, copolymers of benzyl(meth)acrylate, (meth)acrylic acid, N-phenylmaleimide, mono-[2-(meth)acryloyloxyethyl]succinate and styrene, copolymers of allyl (meth)acrylate, (meth)acrylic acid, N-phenylmaleimide, mono-[2-(meth)acryloyloxyethyl]succinate and styrene, co-polymers of benzyl(meth)acrylate, (meth)acrylic acid, N-phenylmaleimide, glycerol mono(meth)acrylate and styrene, copolymers of benzyl(meth)acrylate, ω-carboxy-polycaprolactone mono(meth)acrylate, (meth)acrylic acid, N-phenylmaleimide, glycerol mono(meth)acrylate and styrene, and copolymers of benzyl(meth)acrylate, (meth)acrylic acid, N-cyclohexylmaleimide and styrene.

There can be used as well hydroxystyrene homo- or co-polymers or a novolak type phenol resin, for example, poly (hydroxystyrene) and poly(hydroxystyrene-co-vinylcyclohexanol), a novolak resin, a cresol novolak resin, and a halogenated phenol novolak resin. More specifically, it includes, for example, the methacrylic acid copolymers, the acrylic acid copolymers, the itaconic acid copolymers, the crotonic acid copolymers, the maleic anhydride co-polymers, for example, with styrene as a co-monomer, and maleic acid copolymers, and partially esterified maleic acid copolymers each described in, for example, JP-B-S59/44 615, JP-B-S54/ 34 327, JP-B-S58/12 577, JP-B-S54/25 957, JP-A-S59/53 836, JP-A-S59/71 048, JP-A-S60/159,743, JP-A-S60/258 539, JP-A-H01/152 449, JP-A-H02/199 403 and JP-A-H02/ 199 404, and which copolymers can be further reacted with an amine, as e.g disclosed in U.S. Pat. No. 5,650,263; further, a cellulose derivative having a carboxyl group on a side chain can be used, and particularly preferred are copolymers of benzyl(meth)acrylate and (meth)acrylic acid and copolymers of benzyl(meth)acrylate, (meth)acrylic acid and other monomers, for example as described in U.S. Pat. No. 4,139,391, JP-B-S59/44 615, JP-A-S60/159 743 and JP-A-S60/258,539.

With respect to those having carboxylic acid groups among the above organic binder polymers, it is possible to react some or all of the carboxylic acid groups with glycidyl(meth)acrylate or an epoxy(meth)acrylate to obtain photopolymerizable organic binder polymers for the purpose of improving the photosensitivity, coating film strength, the coating solvent and chemical resistance and the adhesion to the substrate. Examples are disclosed in JP-B-S50/34 443 and JP-B-S50/34 444, U.S. Pat. Nos. 5,153,095, 5,650,233 and 5,677,385, as well as by T. Kudo et al. in J. Appl. Phys., Vol. 37 (1998), p. 3594-3603. The entire contents of all above-mentioned patents and patent applications is enclosed herein by reference.

Among these various kinds of alkali-soluble binders, acrylic acid homo- and copolymers as well as methacrylic acid homo- and copolymers are particularly preferred.

The weight-average molecular weight of the binders is preferably from 500 to 1'000'000, e.g. from 3'000 to 1'000'000, more preferably from 5'000 to 400'000.

The content of an alkali-soluble binder in the dye-containing curable resin composition is preferably from 10 to 90% by weight, more preferably from 20 to 80% by weight, and particularly preferably from 30 to 70% by weight, based on the total solid content of the dye-containing curable resin composition.

Photopolymerisable vinyl compounds are also well known to the person skilled in the art. These monomers contain at least one ethylenic double bond and usually have a boiling point of 100° C. or more.

Examples of suitable photopolymerisable vinyl compounds are polyethylene glycol monoacrylate, polyethylene glycol monomethacrylate, polypropylene glycol monoacrylate, polypropylene glycol monomethacrylate, phenoxyethyl acrylate, phenoxyethyl methacrylate, polyethylene glycol diacrylate, polyethylene glycol dimethacrylate, trimethylolpropane triacrylate, trimethylolpropane triamethacrylate, neopentylglycol diacrylate, neopentylglycol dimethacrylate, pentaerythritol tri-acrylate, pentaerythritol triamethacrylate, pentaerythritol tetraacrylate, pentaerythritol tetramethacrylate, dipentaerythritol pentaacrylate, dipentaerythritol pentamethacrylate, dipentaerythritol hexaacrylate, dipentaerythritol hexamethacrylate, tri(acryloyloxyethyl)isocyanurate. Preferred photopolymerisable vinyl compounds are dipentaerythritol pentaacrylate and dipentaerythritol pentamethacrylate.

The total content of such a photopolymerisable vinyl compound in a colorant-containing curable composition is, while it varies depending on the material thereof, generally from 5 to 70% by weight, preferably from 5 to 50% by weight, and particularly preferably from 7 to 30% by weight, based on the solid content of the composition.

Suitable photoinitiators are also well-known to the person skilled in the art and are preferably selected from halomethyloxadiazols, halomethyl-s-triazines, 3-aryl-substituted coumarins, benzophenones, acetophenones, cyclopentadiene-benzene-iron complexes, oxime esters and oximes.

Suitable photoinitiators are described, for example, in GB-2,339,571, U.S. Pat. No. 6,485,885, GB-2,358,017, GB-2,357,293, WO-02/100 903, J. Photopolym. Sci. Technol. 15, 51-57 (2002), IP. com. Journal IPCOM 000012462D, 3(6), 101-109 (2003), US-2004/0 102 548, US-2004/0 102 673, PCT/EP2006/068 202 and PCT/EP2006/068 254.

Preferred photoinitiators are benzophenones of the formula

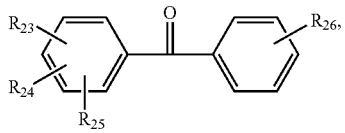

wherein $R_{23}$, $R_{24}$ and $R_{25}$ independently of one another are hydrogen, $C_1$-$C_4$-alkyl, $C_1$-$C_4$-halogenalkyl, $C_1$-$C_4$-alkoxy, chlorine or $N(C_1$-$C_4$-alkyl$)_2$; $R_{26}$ is hydrogen, $C_1$-$C_4$-alkyl, $C_1$-$C_4$-halogenalkyl, phenyl, $N(C_1$-$C_4$-alkyl$)_2$, $COOCH_3$,

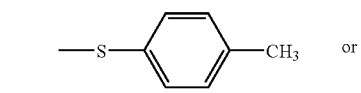

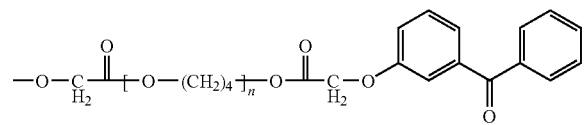

and n is 2-10.

Specific examples are ESACURE TZT® available from Lamberti, (a mixture of 2,4,6-trimethylbenzophenone and 4-methylbenzophenone) and DAROCUR® BP (benzophenone).

Further preferred photoinitiators are alpha-hydroxy ketones, alpha-alkoxyketones or alpha-aminoketones of the formula

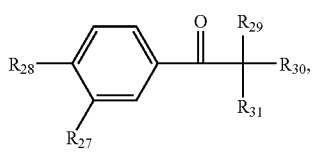

wherein $R_{27}$ is hydrogen or $C_1$-$C_{18}$-alkoxy; $R_{28}$ is hydrogen, $C_1$-$C_{18}$-alkyl, $C_1$-$C_{12}$hydroxyalkyl, $C_1$-$C_{18}$-alkoxy, —$OCH_2CH_2$—$OR_{32}$, morpholino, $C_1$-$C_{18}$alkyl-S—, a group $H_2C$=CH—, $H_2C$=C(CH$_3$)—,

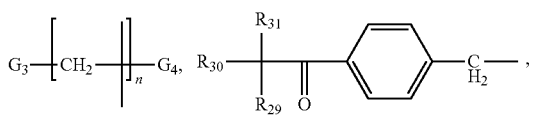

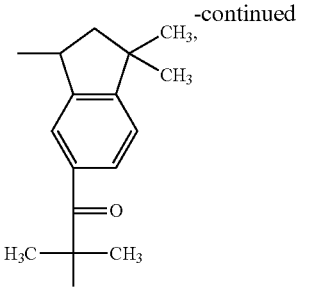

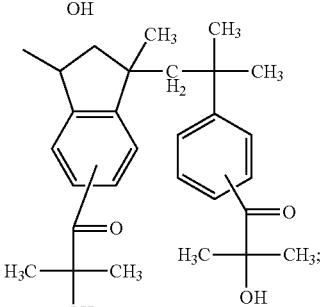

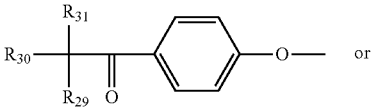

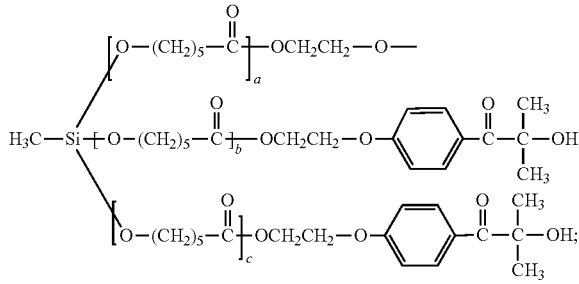

a, b and c are 1-3; n is 2-10; $G_3$ and $G_4$ independently of one another are end groups of the polymeric structure, preferably hydrogen or methyl; $R_{29}$ is hydroxy, $C_1$-$C_{16}$-alkoxy, morpholino, dimethylamino or —$O(CH_2CH_2O)_m$—$C_1$-$C_{16}$-alkyl; $R_{30}$ and $R_{31}$ independently of one another are hydrogen, $C_1$-$C_6$-alkyl, $C_1$-$C_{16}$-alkoxy or —$O(CH_2CH_2O)_m$—$C_1$-$C_{16}$-alkyl; or unsubstituted phenyl or benzyl; or phenyl or benzyl substituted by $C_1$-$C_{12}$-alkyl; or $R_{30}$ and $R_{31}$ together with the carbon atom to which they are attached form a cyclohexyl ring; m is 1-20; with the proviso that $R_{29}$, $R_{30}$ and $R_{31}$ are not all together $C_1$-$C_{16}$-alkoxy or —$O(CH_2CH_2O)_m$—$C_1$-$C_{16}$-alkyl; and $R_{32}$ is hydrogen,

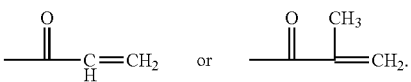

Specific examples are 1-hydroxy-cyclohexyl-phenyl-ketone, a mixture of 1-hydroxy-cyclohexyl-phenyl-ketone with benzophenone, 2-methyl-1[4-(methylthio)phenyl]-2-morpholinopropan-1-one, 2-benzyl-2-dimethylamino-1-(4-morpholinophenyl)-butanone-1,2-dimethylamino-2-(4-methylbenzyl)-1-(4-morpholin-4-yl-phenyl)-butan-1-one, 1-[4-(2-hydroxyethoxy)-phenyl]-2-hydroxy-2-methyl-1-propan-1-one, 2,2-dimethoxy-1,2-diphenylethan-1-one, 2-hydroxy-2-methyl-1-phenyl-propan-1-one, 2-hydroxy-1-{4-[4-(2- hydroxy-2-methyl-propionyl)-benzyl]-phenyl}-2-methyl-propan-1-one, 2-benzyl-1-(3,4-dimethoxy-phenyl)-2-dimethylamino-butan-1-one, 2-hydroxy-1-{4-[4-(2-hydroxy-2-methyl-propionyl)-phenoxy]-phenyl}-2-methyl-propan-1-one,

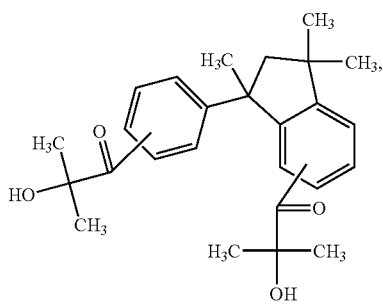

ESACURE® KIP provided by Fratelli Lamberti and 2-hydroxy-1-{1-[4-(2-hydroxy-2-methyl-propionyl)-phenyl]-1,3,3-trimethyl-indan-5-yl}-2-methyl-propan-1-one.

Further preferred photoinitiators are acylphosphine oxides of the formula

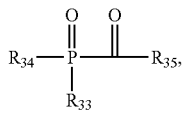

wherein $R_{33}$ and $R_{34}$ independently of one another are unsubstituted $C_1$-$C_{20}$-alkyl, cyclohexyl, cyclopentyl, phenyl, naphthyl or biphenylyl; or $C_1$-$C_{20}$-alkyl, cyclohexyl, cyclopentyl, phenyl, naphthyl or biphenylyl substituted by halogen, $C_1$-$C_{12}$-alkyl, $C_1$-$C_{12}$-alkoxy, $C_1$-$C_{12}$alkylthio or $NR_{36}R_{37}$, or $R_{33}$ and $R_{34}$ are independently of one another —(CO)$R_{35}$; $R_{36}$ and $R_{37}$ independently of one another are hydrogen, unsubstituted $C_1$-$C_{12}$-alkyl or $C_1$-$C_{12}$-alkyl substituted by OH or SH wherein the alkyl chain may be interrupted by one to four oxygen atoms; or $R_{36}$ and $R_{37}$ independently of one another are $C_2$-$C_{12}$-alkenyl, cyclopentyl, cyclohexyl, benzyl or phenyl; $R_{35}$ is unsubstituted cyclohexyl, cyclopentyl, phenyl, naphthyl or biphenylyl, or cyclohexyl, cyclopentyl, phenyl, naphthyl or biphenylyl substituted by halogen, $C_1$-$C_4$-alkyl and/or $C_1$-$C_4$-alkoxy; or $R_{35}$ is a 5- or 6-membered heterocyclic ring having an S atom or N atom. Specific examples thereof are bis(2,4,6-trimethyl-benzoyl)-phenylphosphine oxide, bis(2,4,6-trimethylbenzoyl)-phenyl-ethoxy-phosphine oxide, 2,4,6-trimethylbenzoyl-diphenyl-phosphine oxide and bis(2,6-dimethoxybenzoyl)-2,4,4-trimethylpentylphosphine oxide.

Further preferred photoinitiators are titanocenes of the formula

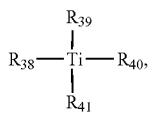

wherein $R_{38}$ and $R_{39}$ independently of one another are cyclopentadienyl optionally mono-, di-, or tri-substituted by $C_1$-$C_{18}$-alkyl, $C_1$-$C_{18}$-alkoxy, cyclopentyl, cyclohexyl or halogen; $R_{40}$ and $R_{41}$ are phenyl having at least one F or $CF_3$ substituent in ortho position to the Ti—C bond and having at least a further substituent which is unsubstituted pyrrolinyl or polyoxaalkyl or which is pyrrolinyl or polyoxaalkyl substituted by one or two $C_1$-$C_{12}$-alkyl, di($C_1$-$C_{12}$-alkyl)aminomethyl, morpholinomethyl, $C_2$-$C_4$-alkenyl, methoxymethyl, ethoxymethyl, trimethylsilyl, formyl, methoxy or phenyl; or $R_{40}$ and $R_{41}$ are

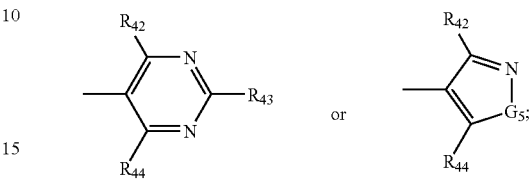

$G_5$ is O, S, or $NR_{45}$; $R_{42}$, $R_{43}$ and $R_{44}$ independently of one another are hydrogen, halogen, $C_2$-$C_{12}$-alkenyl, $C_1$-$C_{12}$alkoxy, $C_2$-$C_{12}$-alkoxy interrupted by one to four oxygen atoms, cyclohexyloxy, cyclopentyloxy, phenoxy, benzyloxy, unsubstituted phenyl or biphenyl or phenyl or biphenyl substituted by $C_1$-$C_4$-alkoxy, halogen, phenylthio or $C_1$-$C_4$-alkylthio, with the proviso that $R_{42}$ and $R_{44}$ are not both hydrogen and that, with respect to the residue

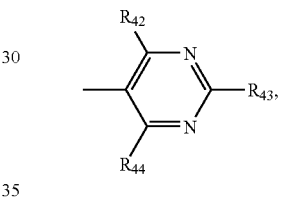

at least one substituent $R_{42}$ or $R_{44}$ is $C_1$-$C_{12}$alkoxy or $C_1$-$C_{12}$alkoxy interrupted by one to four oxygen atoms, cyclohexyloxy, cyclopentyloxy, phenoxy or benzyloxy; and $R_{45}$ is $C_1$-$C_8$alkyl, phenyl or cyclophenyl. Specific examples thereof are bis(η5-2,4-cyclopentadien-1-yl)-bis(2,6-difluoro-3-(1H-pyrrol-1-yl)-phenyl)-titanium and bis(2,6-difluorophenyl)-bis[(1,2,3,4,5-η)-1-methyl-2,4-cyclopentadien-1-yl]-titanium.

Further preferred photoinitiators are phenylglyoxalates of the formula

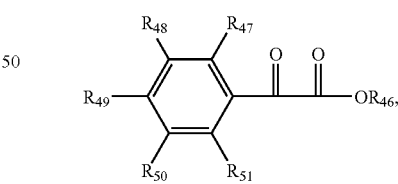

wherein $R_{46}$ is H, $C_1$-$C_{12}$-alkyl or

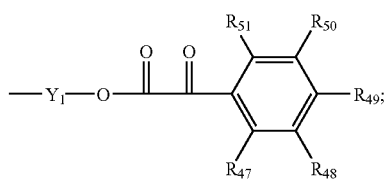

$R_{47}$, $R_{48}$, $R_{49}$, $R_{50}$ and $R_{51}$ independently of one another are hydrogen, unsubstituted $C_1$-$C_{12}$-alkyl or $C_1$-$C_{12}$-alkyl substituted by OH, $C_1$-$C_4$-alkoxy, phenyl, naphthyl, halogen or CN; wherein the alkyl chain optionally is interrupted by one or more oxygen atoms; or $R_{47}$, $R_{48}$, $R_{49}$, $R_{50}$ and $R_{51}$ independently of one another are $C_1$-$C_4$-alkoxy, $C_1$-$C_4$-alkythio or $NR_{36}R_{37}$; $R_{36}$ and $R_{37}$ independently of one another are hydrogen, unsubstituted $C_1$-$C_{12}$-alkyl or $C_1$-$C_{12}$-alkyl substituted by OH or SH wherein the alkyl chain optionally is interrupted by one to four oxygen atoms; or $R_{36}$ and $R_{37}$ independently of one another are $C_2$-$C_{12}$-alkenyl, cyclopentyl, cyclohexyl, benzyl or phenyl; and $Y_1$ is $C_1$-$C_{12}$-alkylene optionally interrupted by one or more oxygen atoms. A specific example thereof is oxo-phenyl-acetic acid 2-[2-(2-oxo-2-phenyl-acetoxy)-ethoxy]-ethyl ester.

Further preferred photoinitiators are oxime esters of the formula

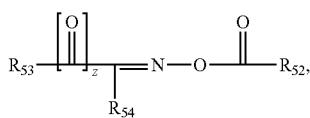

wherein z is 0 or 1; $R_{52}$ is hydrogen, $C_3$-$C_8$cycloalkyl; $C_1$-$C_{12}$alkyl which is unsubstituted or substituted by one or more halogen, phenyl and/or CN; or $R_{52}$ is $C_2$-$C_5$alkenyl; phenyl which is unsubstituted or substituted by one or more $C_1$-$C_6$alkyl, halogen, CN, $OR_{55}$, $SR_{56}$ and/or $NR_{57}R_{58}$; or $R_{52}$ is $C_1$-$C_8$-alkoxy, benzyloxy; or phenoxy which is unsubstituted or substituted by one or more $C_1$-$C_6$alkyl and/or halogen; $R_{53}$ is phenyl, naphthyl, benzoyl or naphthoyl, each of which is substituted 1 to 7 times by halogen, $C_1$-$C_{12}$alkyl, $C_3$-$C_8$cycloalkyl, benzyl, phenoxycarbonyl, $C_2$-$C_{12}$alkoxycarbonyl, $OR_{55}$, $SR_{64}$ $SOR_{56}$, $SO_2R_{56}$ and/or $NR_{57}R_{58}$, wherein the substituents $OR_{55}$, $SR_{56}$ and $NR_{57}R_{58}$ optionally form 5- or 6-membered rings via the radicals $R_{55}$, $R_{56}$, $R_{57}$ and/or $R_{58}$ with further substituents on the phenyl or naphthyl ring; or each of which is substituted by phenyl or by phenyl which is substituted by one or more $OR_{55}$, $SR_{56}$ and/or $NR_{57}R_{58}$; or $R_{53}$ is thioxanthylor

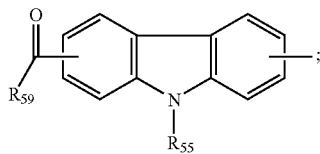

$R_{54}$ is hydrogen; unsubstituted $C_1$-$C_{20}$alkyl or $C_1$-$C_{20}$alkyl substituted by one or more halogen, $OR_{55}$, phenyl; or is $C_3$-$C_8$cycloalkyl; phenyl which is unsubstituted or substituted by one or more $C_1$-$C_6$alkyl, phenyl, halogen, $OR_{55}$, $SR_{56}$ and/or $NR_{57}R_{58}$; or is $C_2$-$C_{20}$alkanoyl or benzoyl which is unsubstituted or substituted by one or more $C_1$-$C_6$alkyl, phenyl, $OR_{55}$, $SR_{56}$ and/or $NR_{57}R_{58}$; or is $C_2$-$C_{12}$alkoxycarbonyl, phenoxycarbonyl, CN, $-CONR_{57}R_{58}$, $NO_2$, $C_1$-$C_4$haloalkyl, $S(O)_y$-$C_1$-$C_6$alkyl or $S(O)_y$-phenyl; y is 1 or 2; $R_{55}$ and $R_{56}$ independently of one another are hydrogen, $C_1$-$C_{20}$alkyl, $C_2$-$C_{12}$alkenyl, $C_3$-$C_8$cycloalkyl, phenyl-$C_1$-$C_3$alkyl; or are $C_1$-$C_8$alkyl which is substituted by —OH, —SH, —CN, $C_1$-$C_8$alkanoyl, benzoyl, which is unsubstituted or substituted by one or more $C_1$-$C_6$alkyl, halogen, —OH, $C_1$-$C_4$alkoxy or $C_1$-$C_4$alkylsulfanyl; or are phenyl or naphthyl, each of which is unsubstituted or substituted by halogen, $C_1$-$C_{12}$alkyl, $C_1$-$C_{12}$alkoxy, phenyl-$C_1$-$C_3$alkyloxy, phenoxy, $C_1$-$C_{12}$alkylsulfanyl, phenylsulfanyl, $-N(C_1$-$C_{12}$alkyl$)_2$, diphenylamino; $R_{57}$ and $R_{58}$ independently of one another are independently of each other are hydrogen, $C_1$-$C_{20}$alkyl, $C_2$-$C_4$hydroxyalkyl, $C_2$-$C_{10}$alkoxyalkyl, $C_2$-$C_5$alkenyl, $C_3$-$C_8$cycloalkyl, phenyl-$C_1$-$C_3$alkyl, $C_1$-$C_8$alkanoyl, $C_3$-$C_{12}$alkenoyl, benzoyl; or are phenyl or naphthyl, each of which is unsubstituted or substituted by $C_1$-$C_{12}$alkyl, benzoyl or $C_1$-$C_{12}$alkoxy; or $R_{57}$ and $R_{58}$ together are $C_2$-$C_6$alkylene optionally interrupted by —O— or —$NR_{55}$— and/or optionally substituted by hydroxyl, $C_1$-$C_4$alkoxy, $C_2$-$C_4$alkanoyloxy or benzoyloxy; $R_{59}$ is $C_1$-$C_{12}$alkyl, phenyl, $C_1$-$C_{12}$alkylphenyl or 2-(2'-tetrahydrofuryl)-phenyl. Specific examples thereof are 1,2-octanedione 1-[4-(phenylthio)phenyl]-2-(O-benzoyloxime), ethanone 1-[9-ethyl-6-(2-methylbenzoyl)-9H-carbazol-3-yl]-1-(O-acetyloxime) and 9H-thioxanthene-2-carboxaldehyde 9-oxo-2-(O-acetyloxime).

A further example of a photoinitiator is Esacure® 1001 available from Lamberti: 1-[4-(4-benzoylphenylsulfanyl)phenyl]-2-methyl-2-(4-methylphenylsulfonyl)propan-1-one

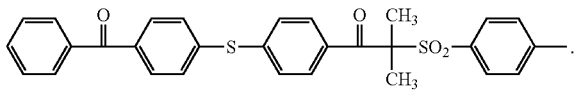

The most preferred photoinitiators are the following compounds:

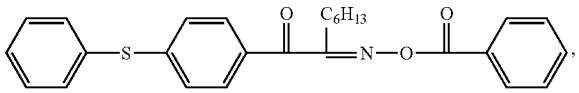

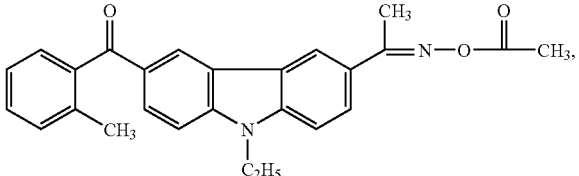

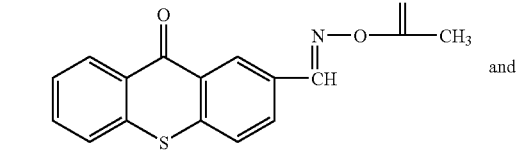

and

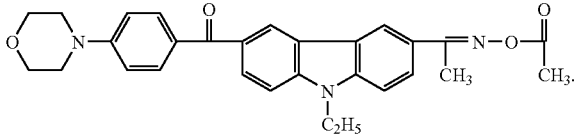

The photoinitiator may be used in combination with a sensitizer and/or a photostabiliser.

The total content of the photoinitiator is preferably from 0.01 to 10% by weight, preferably from 0.05 to 8% by weight, and particularly preferably from 1 to 5% by weight, based on the solid content of the composition.

Upon preparation of the dye-containing curable composition, a solvent is generally used. The solvent is not particularly limited as far as it satisfies solubility to the respective components and coating property of the dye-containing curable composition and it is preferably selected under particular consideration of the solubility of the alkali-soluble binder, the coating property and the safety.

Suitable solvents include esters, e.g. ethyl acetate, butyl acetate, butyl butyrate and methyl methoxyacetate, ether esters such as 1-methoxy-2-propyl-acetate (PGMEA), 2-methoxy-1-propyl-acetate, methylcellosolve acetate, diethylene glycol dimethyl ether, butylcarbitol acetate and polyethylene glycol methyl ether acrylate (PEGMEA), ethers, e.g. tetrahydrofuran, ketones, e.g. 2-butanone, cyclopentanone and cyclohexanone, and aromatic hydrocarbons such as toluene and xylene.

Figure 1:
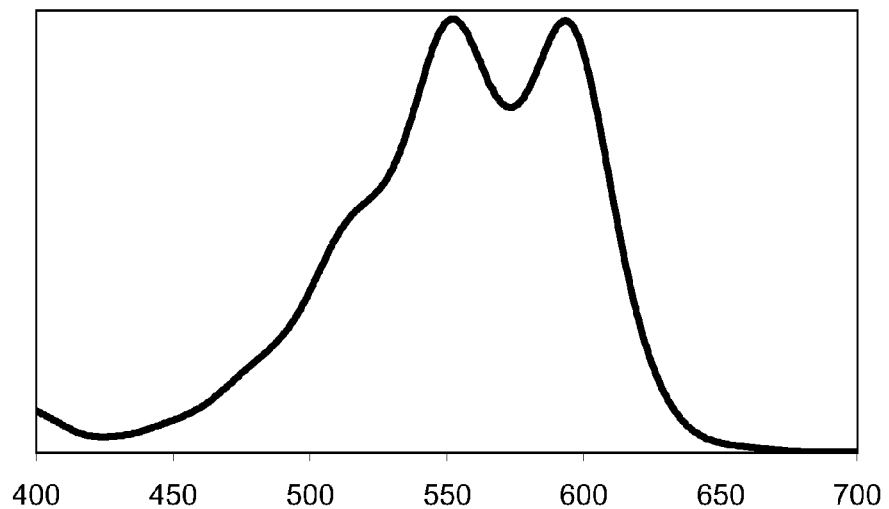
FIG. 1 shows the absorption spectrum of the product according to example 2.
Figure 2:
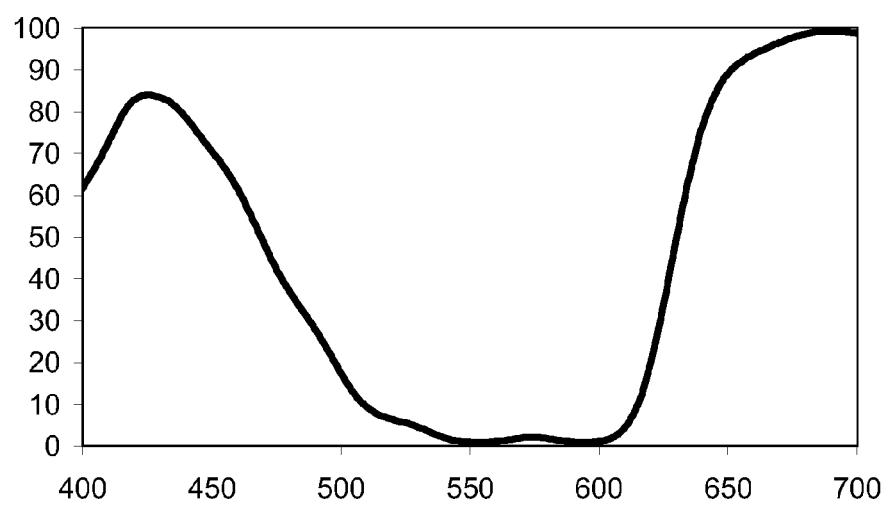
FIG. 2 shows the transmission spectrum of a color filter obtained using the product according to example 2.

The examples which follow illustrate the invention, without limiting it ("%" are by weight where not otherwise specified):

EXAMPLE 1

23 g chlorosulfonic acid are added dropwise under cooling to 0-5° C. to 50 g 1-amino-2-(4-tert-butyl-phenoxy)-4-(2,4,6-trimethyl-phenylamino)-anthraquinone at such a rate, that the temperature does not exceed 10° C. After completion of the addition (about 30 min), the temperature is allowed to rise to 19° C. The reaction mixture is then carefully poured into 2 l of ice-water. The resulting violet suspension of 3-[4-amino-3-(4-tert-butyl-phenoxy)-9,10-dioxo-9,10-dihydro-anthracen-1-ylamino]-2,4,6-trimethyl-benzenesulfonyl chloride is filtered and further used as a wet press-cake in the next step. The previously prepared intermediate is in turn suspended in tetrahydrofuran and cooled down to 0° C. Dropwise addition of an excess of 2-amino-ethanol at 0° C. results in a violet solution, which is then concentrated on a rotary evaporator. Addition of 2 l of water to the residue affords a fine violet suspension which is filtered on a glass filter (porosity 3), and dried for 18 hours at 60° C./5·10³ Pa. The product of following formula is obtained as a fine violet powder:

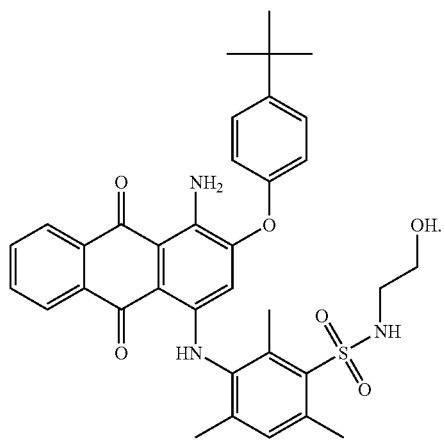

Molecular weight: 627 g/mol (ESI-LC-MS, negative ionisation);

Purity: 96.3% (HPLC, THF, $\lambda_{max}$=256 nm+586 nm);

Melting point: 222° C. (Differential Scanning Calorimetry, 10° C./min);

NMR (DMSO-$d_6$+$D_2O$): 8.22 (m, 2H), 7.78 (m, 2H), 7.28 (d, 2H), 6.96 (s, 1H), 6.90 (d, 2H), 5.41 (s, 1H), 3.24 (t, 2H), 2.64 (m, 2H), 2.41 (s, 3H), 2.27 (s, 3H), 1.96 (s, 3H), 1.18 (s, 9H);

| Analysis: | C | H | N | O | S |
| --- | --- | --- | --- | --- | --- |
| [%] | 66.99 | 6.52 | 6.40 | 15.23 | 5.03 |
| calc.: | 66.97 | 5.94 | 6.69 | 15.29 | 5.11 |

EXAMPLE 2

The same procedure is used as for example 1, with the difference that 2-(2-hydroxy-ethylamino)-ethanol is used instead of 2-amino-ethanol in the second step. The product of following formula is obtained:

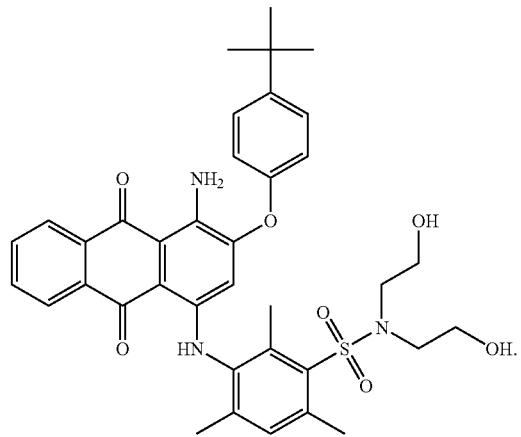

Molecular weight: 671 g/mol (ESI-LC-MS, negative ionisation);

Purity: 96.6% (HPLC, THF, $\lambda_{max}$=240 nm+586 nm);

Melting point: 227° C. (Differential Scanning Calorimetry, 10° C./min);

NMR (DMSO-$d_6$+$D_2O$): 8.25 (m, 2H), 7.81 (m, 2H), 7.32 (d, 2H), 7.01 (s, 1H), 6.91 (d, 2H), 5.43 (s, 1H), 3.35 (m, 4H), 3.14 (t, 4H), 2.43 (s, 3H), 2.26 (s, 3H), 1.98 (s, 3H), 1.20 (s, 9H);

| Analysis: | C | H | N | O | S |
| --- | --- | --- | --- | --- | --- |
| [%] | 66.22 | 6.59 | 6.08 | 16.32 | 4.76 |
| calc.: | 66.15 | 6.15 | 6.25 | 16.67 | 4.77 |

EXAMPLE 3

The same procedure is used as for example 1, with the difference that 2-(2-amino-ethoxy)-ethanol is used instead of 2-amino-ethanol in the second step. The product of following formula is obtained:

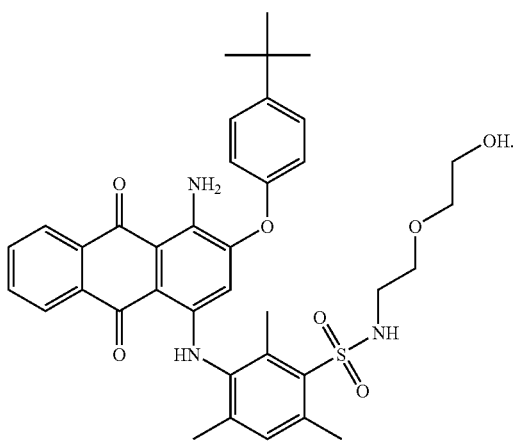

Molecular weight: 671 g/mol (ESI-LC-MS, negative ionisation);
Purity: 92.9% (HPLC, THF, $\lambda_{max}$=256 nm+586 nm);
Melting point: 173° C. (Differential Scanning Calorimetry, 10° C./min);
NMR (DMSO-$d_6$+$D_2O$): 8.28 (m, 2H), 7.83 (m, 2H), 7.34 (d, 2H), 7.03 (s, 1H), 6.97 (d, 2H), 5.50 (s, 1H), 3.42 (m, 4H), 3.29 (m, 4H), 2.50 (s, 3H), 2.35 (s, 3H), 2.03 (s, 3H), 1.25 (s, 9H);

| Analysis: | C | H | N | O | S |
|---|---|---|---|---|---|
| [%] | 65.96 | 6.15 | 5.77 | 16.58 | 4.63 |
| calc.: | 66.15 | 6.15 | 6.25 | 16.67 | 4.77 |

EXAMPLES 4-192

The compounds of the following formulae are prepared in close analogy to examples 1-3:

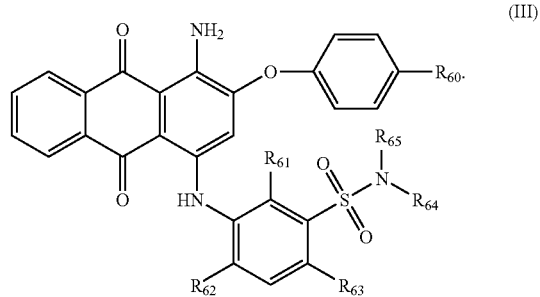

(III)

| Example | X | $R_{60}$ | $R_{61}$ | $R_{62}$ | $R_{63}$ | $R_{64}$ | $R_{65}$ |
|---|---|---|---|---|---|---|---|
| 1 | O | -tert-$C_4H_9$ | —$CH_3$ | —$CH_3$ | —$CH_3$ | H | —$CH_2$—$CH_2$—OH |
| 2 | O | -tert-$C_4H_9$ | —$CH_3$ | —$CH_3$ | —$CH_3$ | —$CH_2$—$CH_2$—OH | —$CH_2$—$CH_2$—OH |
| 3 | O | -tert-$C_4H_9$ | —$CH_3$ | —$CH_3$ | —$CH_3$ | H | —$(CH_2)_2$O—$(CH_2)_2$OH |
| 4 | O | -tert-$C_4H_9$ | —$CH_3$ | H | H | H | —$CH_2$—$CH_2$—OH |
| 5 | O | -tert-$C_4H_9$ | —$CH_3$ | H | H | —$CH_2$—$CH_2$—OH | —$CH_2$—$CH_2$—OH |
| 6 | O | -tert-$C_4H_9$ | —$CH_3$ | H | H | H | —$(CH_2)_2$O—$(CH_2)_2$OH |
| 7 | O | -tert-$C_4H_9$ | —$CH_2$—$CH_3$ | H | H | H | —$CH_2$—$CH_2$—OH |
| 8 | O | -tert-$C_4H_9$ | —$CH_2$—$CH_3$ | H | H | —$CH_2$—$CH_2$—OH | —$CH_2$—$CH_2$—OH |
| 9 | O | -tert-$C_4H_9$ | —$CH_2$—$CH_3$ | H | H | H | —$(CH_2)_2$O—$(CH_2)_2$OH |
| 10 | O | -tert-$C_4H_9$ | —$CH_2$—$CH_3$ | —$CH_2$—$CH_3$ | H | H | —$CH_2$—$CH_2$—OH |
| 11 | O | -tert-$C_4H_9$ | —$CH_2$—$CH_3$ | —$CH_2$—$CH_3$ | H | —$CH_2$—$CH_2$—OH | —$CH_2$—$CH_2$—OH |
| 12 | O | -tert-$C_4H_9$ | —$CH_2$—$CH_3$ | —$CH_2$—$CH_3$ | H | H | —$(CH_2)_2$O—$(CH_2)_2$OH |
| 13 | O | -tert-$C_4H_9$ | —$CH_2$—$CH_3$ | —$CH_2$—$CH_3$ | —$CH_2$—$CH_3$ | H | —$CH_2$—$CH_2$—OH |
| 14 | O | -tert-$C_4H_9$ | —$CH_2$—$CH_3$ | —$CH_2$—$CH_3$ | —$CH_2$—$CH_3$ | —$CH_2$—$CH_2$—OH | —$CH_2$—$CH_2$—OH |
| 15 | O | -tert-$C_4H_9$ | —$CH_2$—$CH_3$ | —$CH_2$—$CH_3$ | —$CH_2$—$CH_3$ | H | —$(CH_2)_2$O—$(CH_2)_2$OH |
| 16 | O | -tert-$C_4H_9$ | Br | Br | —$CH_3$ | H | —$CH_2$—$CH_2$—OH |
| 17 | O | -tert-$C_4H_9$ | Br | Br | —$CH_3$ | —$CH_2$—$CH_2$—OH | —$CH_2$—$CH_2$—OH |
| 18 | O | -tert-$C_4H_9$ | Br | Br | —$CH_3$ | H | —$(CH_2)_2$O—$(CH_2)_2$OH |
| 19 | O | —$CH_3$ | —$CH_3$ | —$CH_3$ | —$CH_3$ | H | —$CH_2$—$CH_2$—OH |
| 20 | O | —$CH_3$ | —$CH_3$ | —$CH_3$ | —$CH_3$ | —$CH_2$—$CH_2$—OH | —$CH_2$—$CH_2$—OH |
| 21 | O | —$CH_3$ | —$CH_3$ | —$CH_3$ | —$CH_3$ | H | —$(CH_2)_2$O—$(CH_2)_2$OH |
| 22 | O | —$CH_3$ | —$CH_3$ | H | H | H | —$CH_2$—$CH_2$—OH |
| 23 | O | —$CH_3$ | —$CH_3$ | H | H | —$CH_2$—$CH_2$—OH | —$CH_2$—$CH_2$—OH |
| 24 | O | —$CH_3$ | —$CH_3$ | H | H | H | —$(CH_2)_2$O—$(CH_2)_2$OH |
| 25 | O | —$CH_3$ | —$CH_2$—$CH_3$ | H | H | H | —$CH_2$—$CH_2$—OH |
| 26 | O | —$CH_3$ | —$CH_2$—$CH_3$ | H | H | —$CH_2$—$CH_2$—OH | —$CH_2$—$CH_2$—OH |
| 27 | O | —$CH_3$ | —$CH_2$—$CH_3$ | H | H | H | —$(CH_2)_2$O—$(CH_2)_2$OH |
| 28 | O | —$CH_3$ | —$CH_2$—$CH_3$ | —$CH_2$—$CH_3$ | H | H | —$CH_2$—$CH_2$—OH |
| 29 | O | —$CH_3$ | —$CH_2$—$CH_3$ | —$CH_2$—$CH_3$ | H | —$CH_2$—$CH_2$—OH | —$CH_2$—$CH_2$—OH |
| 30 | O | —$CH_3$ | —$CH_2$—$CH_3$ | —$CH_2$—$CH_3$ | H | H | —$(CH_2)_2$O—$(CH_2)_2$OH |
| 31 | O | —$CH_3$ | —$CH_2$—$CH_3$ | —$CH_2$—$CH_3$ | —$CH_2$—$CH_3$ | H | —$CH_2$—$CH_2$—OH |
| 32 | O | —$CH_3$ | —$CH_2$—$CH_3$ | —$CH_2$—$CH_3$ | —$CH_2$—$CH_3$ | —$CH_2$—$CH_2$—OH | —$CH_2$—$CH_2$—OH |
| 33 | O | —$CH_3$ | —$CH_2$—$CH_3$ | —$CH_2$—$CH_3$ | —$CH_2$—$CH_3$ | H | —$(CH_2)_2$O—$(CH_2)_2$OH |
| 34 | O | —$CH_3$ | Br | Br | —$CH_3$ | H | —$CH_2$—$CH_2$—OH |
| 35 | O | —$CH_3$ | Br | Br | —$CH_3$ | —$CH_2$—$CH_2$—OH | —$CH_2$—$CH_2$—OH |
| 36 | O | —$CH_3$ | Br | Br | —$CH_3$ | H | —$(CH_2)_2$O—$(CH_2)_2$OH |
| 37 | O | —$C(CH_3)_2$—$CH_2$—$C(CH_3)_3$ | —$CH_3$ | —$CH_3$ | —$CH_3$ | H | —$CH_2$—$CH_2$—OH |
| 38 | O | —$C(CH_3)_2$—$CH_2$—$C(CH_3)_3$ | —$CH_3$ | —$CH_3$ | —$CH_3$ | —$CH_2$—$CH_2$—OH | —$CH_2$—$CH_2$—OH |
| 39 | O | —$C(CH_3)_2$—$CH_2$—$C(CH_3)_3$ | —$CH_3$ | —$CH_3$ | —$CH_3$ | H | —$(CH_2)_2$O—$(CH_2)_2$OH |
| 40 | O | —$C(CH_3)_2$—$CH_2$—$C(CH_3)_3$ | —$CH_3$ | H | H | H | —$CH_2$—$CH_2$—OH |
| 41 | O | —$C(CH_3)_2$—$CH_2$—$C(CH_3)_3$ | —$CH_3$ | H | H | —$CH_2$—$CH_2$—OH | —$CH_2$—$CH_2$—OH |
| 42 | O | —$C(CH_3)_2$—$CH_2$—$C(CH_3)_3$ | —$CH_3$ | H | H | H | —$(CH_2)_2$O—$(CH_2)_2$OH |

-continued

| Example | X | R$_{60}$ | R$_{61}$ | R$_{62}$ | R$_{63}$ | R$_{64}$ | R$_{65}$ |
|---|---|---|---|---|---|---|---|
| 43 | O | —C(CH$_3$)$_2$—CH$_2$—C(CH$_3$)$_3$ | —CH$_2$—CH$_3$ | H | H | H | —CH$_2$—CH$_2$—OH |
| 44 | O | —C(CH$_3$)$_2$—CH$_2$—C(CH$_3$)$_3$ | —CH$_2$—CH$_3$ | H | H | —CH$_2$—CH$_2$—OH | —CH$_2$—CH$_2$—OH |
| 45 | O | —C(CH$_3$)$_2$—CH$_2$—C(CH$_3$)$_3$ | —CH$_2$—CH$_3$ | H | H | H | —(CH$_2$)$_2$O—(CH$_2$)$_2$OH |
| 46 | O | —C(CH$_3$)$_2$—CH$_2$—C(CH$_3$)$_3$ | —CH$_2$—CH$_3$ | —CH$_2$—CH$_3$ | H | H | —CH$_2$—CH$_2$—OH |
| 47 | O | —C(CH$_3$)$_2$—CH$_2$—C(CH$_3$)$_3$ | —CH$_2$—CH$_3$ | —CH$_2$—CH$_3$ | H | —CH$_2$—CH$_2$—OH | —CH$_2$—CH$_2$—OH |
| 48 | O | —C(CH$_3$)$_2$—CH$_2$—C(CH$_3$)$_3$ | —CH$_2$—CH$_3$ | —CH$_2$—CH$_3$ | H | H | —(CH$_2$)$_2$O—(CH$_2$)$_2$OH |
| 49 | O | —C(CH$_3$)$_2$—CH$_2$—C(CH$_3$)$_3$ | —CH$_2$—CH$_3$ | —CH$_2$—CH$_3$ | —CH$_2$—CH$_3$ | H | —CH$_2$—CH$_2$—OH |
| 50 | O | —C(CH$_3$)$_2$—CH$_2$—C(CH$_3$)$_3$ | —CH$_2$—CH$_3$ | —CH$_2$—CH$_3$ | —CH$_2$—CH$_3$ | —CH$_2$—CH$_2$—OH | —CH$_2$—CH$_2$—OH |
| 51 | O | —C(CH$_3$)$_2$—CH$_2$—C(CH$_3$)$_3$ | —CH$_2$—CH$_3$ | —CH$_2$—CH$_3$ | —CH$_2$—CH$_3$ | H | —(CH$_2$)$_2$O—(CH$_2$)$_2$OH |
| 52 | O | —C(CH$_3$)$_2$—CH$_2$—C(CH$_3$)$_3$ | Br | Br | —CH$_3$ | H | —CH$_2$—CH$_2$—OH |
| 53 | S | —C(CH$_3$)$_2$—CH$_2$—C(CH$_3$)$_3$ | Br | Br | —CH$_3$ | —CH$_2$—CH$_2$—OH | —CH$_2$—CH$_2$—OH |
| 54 | S | —C(CH$_3$)$_2$—CH$_2$—C(CH$_3$)$_3$ | Br | Br | —CH$_3$ | H | —(CH$_2$)$_2$O—(CH$_2$)$_2$OH |
| 55 | S | -tert-C$_4$H$_9$ | —CH$_3$ | —CH$_3$ | —CH$_3$ | H | —CH$_2$—CH$_2$—OH |
| 56 | S | -tert-C$_4$H$_9$ | —CH$_3$ | —CH$_3$ | —CH$_3$ | —CH$_2$—CH$_2$—OH | —CH$_2$—CH$_2$—OH |
| 57 | S | -tert-C$_4$H$_9$ | —CH$_3$ | —CH$_3$ | —CH$_3$ | H | —(CH$_2$)$_2$O—(CH$_2$)$_2$OH |
| 58 | S | -tert-C$_4$H$_9$ | —CH$_3$ | H | H | H | —CH$_2$—CH$_2$—OH |
| 59 | S | -tert-C$_4$H$_9$ | —CH$_3$ | H | H | —CH$_2$—CH$_2$—OH | —CH$_2$—CH$_2$—OH |
| 60 | S | -tert-C$_4$H$_9$ | —CH$_3$ | H | H | H | —(CH$_2$)$_2$O—(CH$_2$)$_2$OH |
| 61 | S | -tert-C$_4$H$_9$ | —CH$_2$—CH$_3$ | H | H | H | —CH$_2$—CH$_2$—OH |
| 62 | S | -tert-C$_4$H$_9$ | —CH$_2$—CH$_3$ | H | H | —CH$_2$—CH$_2$—OH | —CH$_2$—CH$_2$—OH |
| 63 | S | -tert-C$_4$H$_9$ | —CH$_2$—CH$_3$ | H | H | H | —(CH$_2$)$_2$O—(CH$_2$)$_2$OH |
| 64 | S | -tert-C$_4$H$_9$ | —CH$_2$—CH$_3$ | —CH$_2$—CH$_3$ | H | H | —CH$_2$—CH$_2$—OH |
| 65 | S | -tert-C$_4$H$_9$ | —CH$_2$—CH$_3$ | —CH$_2$—CH$_3$ | H | —CH$_2$—CH$_2$—OH | —CH$_2$—CH$_2$—OH |
| 66 | S | -tert-C$_4$H$_9$ | —CH$_2$—CH$_3$ | —CH$_2$—CH$_3$ | H | H | —(CH$_2$)$_2$O—(CH$_2$)$_2$OH |
| 67 | S | -tert-C$_4$H$_9$ | —CH$_2$—CH$_3$ | —CH$_2$—CH$_3$ | —CH$_2$—CH$_3$ | H | —CH$_2$—CH$_2$—OH |
| 68 | S | -tert-C$_4$H$_9$ | —CH$_2$—CH$_3$ | —CH$_2$—CH$_3$ | —CH$_2$—CH$_3$ | —CH$_2$—CH$_2$—OH | —CH$_2$—CH$_2$—OH |
| 69 | S | -tert-C$_4$H$_9$ | —CH$_2$—CH$_3$ | —CH$_2$—CH$_3$ | —CH$_2$—CH$_3$ | H | —(CH$_2$)$_2$O—(CH$_2$)$_2$OH |
| 70 | S | -tert-C$_4$H$_9$ | Br | Br | —CH$_3$ | H | —CH$_2$—CH$_2$—OH |
| 71 | S | -tert-C$_4$H$_9$ | Br | Br | —CH$_3$ | —CH$_2$—CH$_2$—OH | —CH$_2$—CH$_2$—OH |
| 72 | S | -tert-C$_4$H$_9$ | Br | Br | —CH$_3$ | H | —(CH$_2$)$_2$O—(CH$_2$)$_2$OH |
| 73 | S | —CH$_3$ | —CH$_3$ | —CH$_3$ | —CH$_3$ | H | —CH$_2$—CH$_2$—OH |
| 74 | S | —CH$_3$ | —CH$_3$ | —CH$_3$ | —CH$_3$ | —CH$_2$—CH$_2$—OH | —CH$_2$—CH$_2$—OH |
| 75 | S | —CH$_3$ | —CH$_3$ | —CH$_3$ | —CH$_3$ | H | —(CH$_2$)$_2$O—(CH$_2$)$_2$OH |
| 76 | S | —CH$_3$ | —CH$_3$ | H | H | H | —CH$_2$—CH$_2$—OH |
| 77 | S | —CH$_3$ | —CH$_3$ | H | H | —CH$_2$—CH$_2$—OH | —CH$_2$—CH$_2$—OH |
| 78 | S | —CH$_3$ | —CH$_3$ | H | H | H | —(CH$_2$)$_2$O—(CH$_2$)$_2$OH |
| 79 | S | —CH$_3$ | —CH$_2$—CH$_3$ | H | H | H | —CH$_2$—CH$_2$—OH |
| 80 | S | —CH$_3$ | —CH$_2$—CH$_3$ | H | H | —CH$_2$—CH$_2$—OH | —CH$_2$—CH$_2$—OH |
| 81 | S | —CH$_3$ | —CH$_2$—CH$_3$ | H | H | H | —(CH$_2$)$_2$O—(CH$_2$)$_2$OH |
| 82 | S | —CH$_3$ | —CH$_2$—CH$_3$ | —CH$_2$—CH$_3$ | H | H | —CH$_2$—CH$_2$—OH |
| 83 | S | —CH$_3$ | —CH$_2$—CH$_3$ | —CH$_2$—CH$_3$ | H | —CH$_2$—CH$_2$—OH | —CH$_2$—CH$_2$—OH |
| 84 | S | —CH$_3$ | —CH$_2$—CH$_3$ | —CH$_2$—CH$_3$ | H | H | —(CH$_2$)$_2$O—(CH$_2$)$_2$OH |
| 85 | S | —CH$_3$ | —CH$_2$—CH$_3$ | —CH$_2$—CH$_3$ | —CH$_2$—CH$_3$ | H | —CH$_2$—CH$_2$—OH |
| 86 | S | —CH$_3$ | —CH$_2$—CH$_3$ | —CH$_2$—CH$_3$ | —CH$_2$—CH$_3$ | —CH$_2$—CH$_2$—OH | —CH$_2$—CH$_2$—OH |
| 87 | S | —CH$_3$ | —CH$_2$—CH$_3$ | —CH$_2$—CH$_3$ | —CH$_2$—CH$_3$ | H | —(CH$_2$)$_2$O—(CH$_2$)$_2$OH |
| 88 | S | —CH$_3$ | Br | Br | —CH$_3$ | H | —CH$_2$—CH$_2$—OH |
| 89 | S | —CH$_3$ | Br | Br | —CH$_3$ | —CH$_2$—CH$_2$—OH | —CH$_2$—CH$_2$—OH |
| 90 | S | —CH$_3$ | Br | Br | —CH$_3$ | H | —(CH$_2$)$_2$O—(CH$_2$)$_2$OH |
| 91 | S | —C(CH$_3$)$_2$—CH$_2$—C(CH$_3$)$_3$ | —CH$_3$ | —CH$_3$ | —CH$_3$ | H | —CH$_2$—CH$_2$—OH |
| 92 | S | —C(CH$_3$)$_2$—CH$_2$—C(CH$_3$)$_3$ | —CH$_3$ | —CH$_3$ | —CH$_3$ | —CH$_2$—CH$_2$—OH | —CH$_2$—CH$_2$—OH |
| 93 | S | —C(CH$_3$)$_2$—CH$_2$—C(CH$_3$)$_3$ | —CH$_3$ | —CH$_3$ | —CH$_3$ | H | —(CH$_2$)$_2$O—(CH$_2$)$_2$OH |
| 94 | S | —C(CH$_3$)$_2$—CH$_2$—C(CH$_3$)$_3$ | —CH$_3$ | H | H | H | —CH$_2$—CH$_2$—OH |
| 95 | S | —C(CH$_3$)$_2$—CH$_2$—C(CH$_3$)$_3$ | —CH$_3$ | H | H | —CH$_2$—CH$_2$—OH | —CH$_2$—CH$_2$—OH |
| 96 | S | —C(CH$_3$)$_2$—CH$_2$—C(CH$_3$)$_3$ | —CH$_3$ | H | H | H | —(CH$_2$)$_2$O—(CH$_2$)$_2$OH |
| 97 | S | —C(CH$_3$)$_2$—CH$_2$—C(CH$_3$)$_3$ | —CH$_2$—CH$_3$ | H | H | H | —CH$_2$—CH$_2$—OH |
| 98 | S | —C(CH$_3$)$_2$—CH$_2$—C(CH$_3$)$_3$ | —CH$_2$—CH$_3$ | H | H | —CH$_2$—CH$_2$—OH | —CH$_2$—CH$_2$—OH |
| 99 | S | —C(CH$_3$)$_2$—CH$_2$—C(CH$_3$)$_3$ | —CH$_2$—CH$_3$ | H | H | H | —(CH$_2$)$_2$O—(CH$_2$)$_2$OH |
| 100 | S | —C(CH$_3$)$_2$—CH$_2$—C(CH$_3$)$_3$ | —CH$_2$—CH$_3$ | —CH$_2$—CH$_3$ | H | H | —CH$_2$—CH$_2$—OH |
| 101 | S | —C(CH$_3$)$_2$—CH$_2$—C(CH$_3$)$_3$ | —CH$_2$—CH$_3$ | —CH$_2$—CH$_3$ | H | —CH$_2$—CH$_2$—OH | —CH$_2$—CH$_2$—OH |
| 102 | S | —C(CH$_3$)$_2$—CH$_2$—C(CH$_3$)$_3$ | —CH$_2$—CH$_3$ | —CH$_2$—CH$_3$ | H | H | —(CH$_2$)$_2$O—(CH$_2$)$_2$OH |
| 103 | S | —C(CH$_3$)$_2$—CH$_2$—C(CH$_3$)$_3$ | —CH$_2$—CH$_3$ | —CH$_2$—CH$_3$ | —CH$_2$—CH$_3$ | H | —CH$_2$—CH$_2$—OH |
| 104 | S | —C(CH$_3$)$_2$—CH$_2$—C(CH$_3$)$_3$ | —CH$_2$—CH$_3$ | —CH$_2$—CH$_3$ | —CH$_2$—CH$_3$ | —CH$_2$—CH$_2$—OH | —CH$_2$—CH$_2$—OH |
| 105 | S | —C(CH$_3$)$_2$—CH$_2$—C(CH$_3$)$_3$ | —CH$_2$—CH$_3$ | —CH$_2$—CH$_3$ | —CH$_2$—CH$_3$ | H | —(CH$_2$)$_2$O—(CH$_2$)$_2$OH |
| 106 | S | —C(CH$_3$)$_2$—CH$_2$—C(CH$_3$)$_3$ | Br | Br | —CH$_3$ | H | —CH$_2$—CH$_2$—OH |
| 107 | S | —C(CH$_3$)$_2$—CH$_2$—C(CH$_3$)$_3$ | Br | Br | —CH$_3$ | —CH$_2$—CH$_2$—OH | —CH$_2$—CH$_2$—OH |
| 108 | S | —C(CH$_3$)$_2$—CH$_2$—C(CH$_3$)$_3$ | Br | Br | —CH$_3$ | H | —(CH$_2$)$_2$O—(CH$_2$)$_2$OH |
| 109 | O | -tert-C$_4$H$_9$ | —CH$_3$ | —CH$_3$ | —CH$_3$ | —CH$_2$—CH(CH$_3$)OH | —CH$_2$—CH(CH$_3$)OH |
| 110 | O | -tert-C$_4$H$_9$ | —CH$_3$ | H | H | —CH$_2$—CH(CH$_3$)OH | —CH$_2$—CH(CH$_3$)OH |
| 111 | O | -tert-C$_4$H$_9$ | —CH$_2$—CH$_3$ | H | H | —CH$_2$—CH(CH$_3$)OH | —CH$_2$—CH(CH$_3$)OH |
| 112 | O | -tert-C$_4$H$_9$ | —CH$_2$—CH$_3$ | —CH$_2$—CH$_3$ | H | —CH$_2$—CH(CH$_3$)OH | —CH$_2$—CH(CH$_3$)OH |
| 113 | O | -tert-C$_4$H$_9$ | —CH$_2$—CH$_3$ | —CH$_2$—CH$_3$ | —CH$_2$—CH$_3$ | —CH$_2$—CH(CH$_3$)OH | —CH$_2$—CH(CH$_3$)OH |
| 114 | O | -tert-C$_4$H$_9$ | Br | Br | —CH$_3$ | —CH$_2$—CH(CH$_3$)OH | —CH$_2$—CH(CH$_3$)OH |
| 115 | O | —CH$_3$ | —CH$_3$ | —CH$_3$ | —CH$_3$ | —CH$_2$—CH(CH$_3$)OH | —CH$_2$—CH(CH$_3$)OH |
| 116 | O | —CH$_3$ | —CH$_3$ | H | H | —CH$_2$—CH(CH$_3$)OH | —CH$_2$—CH(CH$_3$)OH |
| 117 | O | —CH$_3$ | —CH$_2$—CH$_3$ | H | H | —CH$_2$—CH(CH$_3$)OH | —CH$_2$—CH(CH$_3$)OH |
| 118 | O | —CH$_3$ | —CH$_2$—CH$_3$ | —CH$_2$—CH$_3$ | H | —CH$_2$—CH(CH$_3$)OH | —CH$_2$—CH(CH$_3$)OH |
| 119 | O | —CH$_3$ | —CH$_2$—CH$_3$ | —CH$_2$—CH$_3$ | —CH$_2$—CH$_3$ | —CH$_2$—CH(CH$_3$)OH | —CH$_2$—CH(CH$_3$)OH |
| 120 | O | —CH$_3$ | Br | Br | —CH$_3$ | —CH$_2$—CH(CH$_3$)OH | —CH$_2$—CH(CH$_3$)OH |

-continued

| Example | X | R$_{60}$ | R$_{61}$ | R$_{62}$ | R$_{63}$ | R$_{64}$ | R$_{65}$ |
|---|---|---|---|---|---|---|---|
| 121 | O | —C(CH$_3$)$_2$—CH$_2$—C(CH$_3$)$_3$ | —CH$_3$ | —CH$_3$ | —CH$_3$ | —CH$_2$—CH(CH$_3$)OH | —CH$_2$—CH(CH$_3$)OH |
| 122 | O | —C(CH$_3$)$_2$—CH$_2$—C(CH$_3$)$_3$ | —CH$_3$ | H | H | —CH$_2$—CH(CH$_3$)OH | —CH$_2$—CH(CH$_3$)OH |
| 123 | O | —C(CH$_3$)$_2$—CH$_2$—C(CH$_3$)$_3$ | —CH$_2$—CH$_3$ | H | H | —CH$_2$—CH(CH$_3$)OH | —CH$_2$—CH(CH$_3$)OH |
| 124 | O | —C(CH$_3$)$_2$—CH$_2$—C(CH$_3$)$_3$ | —CH$_2$—CH$_3$ | —CH$_2$—CH$_3$ | H | —CH$_2$—CH(CH$_3$)OH | —CH$_2$—CH(CH$_3$)OH |
| 125 | O | —C(CH$_3$)$_2$—CH$_2$—C(CH$_3$)$_3$ | —CH$_2$—CH$_3$ | —CH$_2$—CH$_3$ | —CH$_2$—CH$_3$ | —CH$_2$—CH(CH$_3$)OH | —CH$_2$—CH(CH$_3$)OH |
| 126 | O | —C(CH$_3$)$_2$—CH$_2$—C(CH$_3$)$_3$ | Br | Br | —CH$_3$ | —CH$_2$—CH(CH$_3$)OH | —CH$_2$—CH(CH$_3$)OH |
| 127 | S | -tert-C$_4$H$_9$ | —CH$_3$ | —CH$_3$ | —CH$_3$ | —CH$_2$—CH(CH$_3$)OH | —CH$_2$—CH(CH$_3$)OH |
| 128 | S | -tert-C$_4$H$_9$ | —CH$_3$ | H | H | —CH$_2$—CH(CH$_3$)OH | —CH$_2$—CH(CH$_3$)OH |
| 129 | S | -tert-C$_4$H$_9$ | —CH$_2$—CH$_3$ | H | H | —CH$_2$—CH(CH$_3$)OH | —CH$_2$—CH(CH$_3$)OH |
| 130 | S | -tert-C$_4$H$_9$ | —CH$_2$—CH$_3$ | —CH$_2$—CH$_3$ | H | —CH$_2$—CH(CH$_3$)OH | —CH$_2$—CH(CH$_3$)OH |
| 131 | S | -tert-C$_4$H$_9$ | —CH$_2$—CH$_3$ | —CH$_2$—CH$_3$ | —CH$_2$—CH$_3$ | —CH$_2$—CH(CH$_3$)OH | —CH$_2$—CH(CH$_3$)OH |
| 132 | S | -tert-C$_4$H$_9$ | Br | Br | —CH$_3$ | —CH$_2$—CH(CH$_3$)OH | —CH$_2$—CH(CH$_3$)OH |
| 133 | S | —CH$_3$ | —CH$_3$ | —CH$_3$ | —CH$_3$ | —CH$_2$—CH(CH$_3$)OH | —CH$_2$—CH(CH$_3$)OH |
| 134 | S | —CH$_3$ | —CH$_3$ | H | H | —CH$_2$—CH(CH$_3$)OH | —CH$_2$—CH(CH$_3$)OH |
| 135 | S | —CH$_3$ | —CH$_2$—CH$_3$ | H | H | —CH$_2$—CH(CH$_3$)OH | —CH$_2$—CH(CH$_3$)OH |
| 136 | S | —CH$_3$ | —CH$_2$—CH$_3$ | —CH$_2$—CH$_3$ | H | —CH$_2$—CH(CH$_3$)OH | —CH$_2$—CH(CH$_3$)OH |
| 137 | S | —CH$_3$ | —CH$_2$—CH$_3$ | —CH$_2$—CH$_3$ | —CH$_2$—CH$_3$ | —CH$_2$—CH(CH$_3$)OH | —CH$_2$—CH(CH$_3$)OH |
| 138 | S | —CH$_3$ | Br | Br | —CH$_3$ | —CH$_2$—CH(CH$_3$)OH | —CH$_2$—CH(CH$_3$)OH |
| 139 | S | —C(CH$_3$)$_2$—CH$_2$—C(CH$_3$)$_3$ | —CH$_3$ | —CH$_3$ | —CH$_3$ | —CH$_2$—CH(CH$_3$)OH | —CH$_2$—CH(CH$_3$)OH |
| 140 | S | —C(CH$_3$)$_2$—CH$_2$—C(CH$_3$)$_3$ | —CH$_3$ | H | H | —CH$_2$—CH(CH$_3$)OH | —CH$_2$—CH(CH$_3$)OH |
| 141 | S | —C(CH$_3$)$_2$—CH$_2$—C(CH$_3$)$_3$ | —CH$_2$—CH$_3$ | H | H | —CH$_2$—CH(CH$_3$)OH | —CH$_2$—CH(CH$_3$)OH |
| 142 | S | —C(CH$_3$)$_2$—CH$_2$—C(CH$_3$)$_3$ | —CH$_2$—CH$_3$ | —CH$_2$—CH$_3$ | H | —CH$_2$—CH(CH$_3$)OH | —CH$_2$—CH(CH$_3$)OH |
| 143 | S | —C(CH$_3$)$_2$—CH$_2$—C(CH$_3$)$_3$ | —CH$_2$—CH$_3$ | —CH$_2$—CH$_3$ | —CH$_2$—CH$_3$ | —CH$_2$—CH(CH$_3$)OH | —CH$_2$—CH(CH$_3$)OH |
| 144 | S | —C(CH$_3$)$_2$—CH$_2$—C(CH$_3$)$_3$ | Br | Br | —CH$_3$ | —CH$_2$—CH(CH$_3$)OH | —CH$_2$—CH(CH$_3$)OH |
| 145 | O | H | —CH$_3$ | —CH$_3$ | —CH$_3$ | H | —CH$_2$—CH$_2$—OH |
| 146 | O | H | —CH$_3$ | —CH$_3$ | —CH$_3$ | —CH$_2$—CH$_2$—OH | —CH$_2$—CH$_2$—OH |
| 147 | O | H | —CH$_3$ | —CH$_3$ | —CH$_3$ | H | —(CH$_2$)$_2$O—(CH$_2$)$_2$OH |
| 148 | O | H | —CH$_3$ | H | H | H | —CH$_2$—CH$_2$—OH |
| 149 | O | H | —CH$_3$ | H | H | —CH$_2$—CH$_2$—OH | —CH$_2$—CH$_2$—OH |
| 150 | O | H | —CH$_3$ | H | H | H | —(CH$_2$)$_2$O—(CH$_2$)$_2$OH |
| 151 | O | H | —CH$_2$—CH$_3$ | H | H | H | —CH$_2$—CH$_2$—OH |
| 152 | O | H | —CH$_2$—CH$_3$ | H | H | —CH$_2$—CH$_2$—OH | —CH$_2$—CH$_2$—OH |
| 153 | O | H | —CH$_2$—CH$_3$ | H | H | H | —(CH$_2$)$_2$O—(CH$_2$)$_2$OH |
| 154 | O | H | —CH$_2$—CH$_3$ | —CH$_2$—CH$_3$ | H | H | —CH$_2$—CH$_2$—OH |
| 155 | O | H | —CH$_2$—CH$_3$ | —CH$_2$—CH$_3$ | H | —CH$_2$—CH$_2$—OH | —CH$_2$—CH$_2$—OH |
| 156 | O | H | —CH$_2$—CH$_3$ | —CH$_2$—CH$_3$ | H | H | —(CH$_2$)$_2$O—(CH$_2$)$_2$OH |
| 157 | O | H | —CH$_2$—CH$_3$ | —CH$_2$—CH$_3$ | —CH$_2$—CH$_3$ | H | —CH$_2$—CH$_2$—OH |
| 158 | O | H | —CH$_2$—CH$_3$ | —CH$_2$—CH$_3$ | —CH$_2$—CH$_3$ | —CH$_2$—CH$_2$—OH | —CH$_2$—CH$_2$—OH |
| 159 | O | H | —CH$_2$—CH$_3$ | —CH$_2$—CH$_3$ | —CH$_2$—CH$_3$ | H | —(CH$_2$)$_2$O—(CH$_2$)$_2$OH |
| 160 | O | H | Br | Br | —CH$_3$ | H | —CH$_2$—CH$_2$—OH |
| 161 | O | H | Br | Br | —CH$_3$ | —CH$_2$—CH$_2$—OH | —CH$_2$—CH$_2$—OH |
| 162 | O | H | Br | Br | —CH$_3$ | H | —(CH$_2$)$_2$O—(CH$_2$)$_2$OH |
| 163 | S | H | —CH$_3$ | —CH$_3$ | —CH$_3$ | H | —CH$_2$—CH$_2$—OH |
| 164 | S | H | —CH$_3$ | —CH$_3$ | —CH$_3$ | —CH$_2$—CH$_2$—OH | —CH$_2$—CH$_2$—OH |
| 165 | S | H | —CH$_3$ | —CH$_3$ | —CH$_3$ | H | —(CH$_2$)$_2$O—(CH$_2$)$_2$OH |
| 166 | S | H | —CH$_3$ | H | H | H | —CH$_2$—CH$_2$—OH |
| 167 | S | H | —CH$_3$ | H | H | —CH$_2$—CH$_2$—OH | —CH$_2$—CH$_2$—OH |
| 168 | S | H | —CH$_3$ | H | H | H | —(CH$_2$)$_2$O—(CH$_2$)$_2$OH |
| 169 | S | H | —CH$_2$—CH$_3$ | H | H | H | —CH$_2$—CH$_2$—OH |
| 170 | S | H | —CH$_2$—CH$_3$ | H | H | —CH$_2$—CH$_2$—OH | —CH$_2$—CH$_2$—OH |
| 171 | S | H | —CH$_2$—CH$_3$ | H | H | H | —(CH$_2$)$_2$O—(CH$_2$)$_2$OH |
| 172 | S | H | —CH$_2$—CH$_3$ | —CH$_2$—CH$_3$ | H | H | —CH$_2$—CH$_2$—OH |
| 173 | S | H | —CH$_2$—CH$_3$ | —CH$_2$—CH$_3$ | H | —CH$_2$—CH$_2$—OH | —CH$_2$—CH$_2$—OH |
| 174 | S | H | —CH$_2$—CH$_3$ | —CH$_2$—CH$_3$ | H | H | —(CH$_2$)$_2$O—(CH$_2$)$_2$OH |
| 175 | S | H | —CH$_2$—CH$_3$ | —CH$_2$—CH$_3$ | —CH$_2$—CH$_3$ | H | —CH$_2$—CH$_2$—OH |
| 176 | S | H | —CH$_2$—CH$_3$ | —CH$_2$—CH$_3$ | —CH$_2$—CH$_3$ | —CH$_2$—CH$_2$—OH | —CH$_2$—CH$_2$—OH |
| 177 | S | H | —CH$_2$—CH$_3$ | —CH$_2$—CH$_3$ | —CH$_2$—CH$_3$ | H | —(CH$_2$)$_2$O—(CH$_2$)$_2$OH |
| 178 | S | H | Br | Br | —CH$_3$ | H | —CH$_2$—CH$_2$—OH |
| 179 | S | H | Br | Br | —CH$_3$ | —CH$_2$—CH$_2$—OH | —CH$_2$—CH$_2$—OH |
| 180 | S | H | Br | Br | —CH$_3$ | H | —(CH$_2$)$_2$O—(CH$_2$)$_2$OH |
| 181 | O | H | —CH$_3$ | —CH$_3$ | —CH$_3$ | —CH$_2$—CH(CH$_3$)OH | —CH$_2$—CH(CH$_3$)OH |
| 182 | O | H | —CH$_3$ | H | H | —CH$_2$—CH(CH$_3$)OH | —CH$_2$—CH(CH$_3$)OH |
| 183 | O | H | —CH$_2$—CH$_3$ | H | H | —CH$_2$—CH(CH$_3$)OH | —CH$_2$—CH(CH$_3$)OH |
| 184 | O | H | —CH$_2$—CH$_3$ | —CH$_2$—CH$_3$ | H | —CH$_2$—CH(CH$_3$)OH | —CH$_2$—CH(CH$_3$)OH |
| 185 | O | H | —CH$_2$—CH$_3$ | —CH$_2$—CH$_3$ | —CH$_2$—CH$_3$ | —CH$_2$—CH(CH$_3$)OH | —CH$_2$—CH(CH$_3$)OH |
| 186 | O | H | Br | Br | —CH$_3$ | —CH$_2$—CH(CH$_3$)OH | —CH$_2$—CH(CH$_3$)OH |
| 187 | S | H | —CH$_3$ | —CH$_3$ | —CH$_3$ | —CH$_2$—CH(CH$_3$)OH | —CH$_2$—CH(CH$_3$)OH |
| 188 | S | H | —CH$_3$ | H | H | —CH$_2$—CH(CH$_3$)OH | —CH$_2$—CH(CH$_3$)OH |
| 189 | S | H | —CH$_2$—CH$_3$ | H | H | —CH$_2$—CH(CH$_3$)OH | —CH$_2$—CH(CH$_3$)OH |
| 190 | S | H | —CH$_2$—CH$_3$ | —CH$_2$—CH$_3$ | H | —CH$_2$—CH(CH$_3$)OH | —CH$_2$—CH(CH$_3$)OH |
| 191 | S | H | —CH$_2$—CH$_3$ | —CH$_2$—CH$_3$ | —CH$_2$—CH$_3$ | —CH$_2$—CH(CH$_3$)OH | —CH$_2$—CH(CH$_3$)OH |
| 192 | S | H | Br | Br | —CH$_3$ | —CH$_2$—CH(CH$_3$)OH | —CH$_2$—CH(CH$_3$)OH |

EXAMPLES 193-204

General Procedure

A liquid formulation containing an acrylic acid/acrylate polymeric resin binder, an organic solvent, a photoinitiator, a polymerisable monomer, a dye and optionally a dispersant is homogenized by stirring and filtered through a 0.45 μm Teflon™ filter. Spin coating of this formulation is performed on glass plates at various spinning speeds in order to achieve various layer thicknesses. Soft bake at 100° C. for 2 min affords the required thin transparent layer. UV exposure through a mask for 30 s followed by basic aqueous development and final post bake for 5 min at 200° C. results in a structured pattern.

Formulation A:

| | |
|---|---|
| 8.89 parts | Disperbyk ® 161 (cationic polyurethane, dispersing agent) |
| 19.41 parts | acrylic acid/acrylate resin binder |
| 67.20 parts | cyclopentanone |
| 10.53 parts | Sartomer ® 399 (dipentaerytritol pentaacrylate) |
| 0.84 parts | 2,4-bis(trichloromethyl)-6-(4-methoxyphenyl)-1,3,5-triazine |

Formulation B:

| | |
|---|---|
| 8.41 parts | Disperbyk ® 161 (cationic polyurethane, dispersing agent) |
| 19.27 parts | acrylic acid/acrylate resin binder |
| 67.10 parts | cyclopentanone |
| 10.90 parts | Sartomer ® 399 (dipentaerytritol pentaacrylate) |
| 0.84 parts | 2,4-bis(trichloromethyl)-6-(4-methoxyphenyl)-1,3,5-triazine |

Formulation C:

| | |
|---|---|
| 10.85 parts | C.I. Pigment Blue 15:6 |
| 1.09 parts | Solsperse ® 5000 |
| 15.89 parts | Disperbyk ® 161 |
| 56.63 parts | 1-methoxy-2-propyl-acetate (PGMEA) |
| 15.54 parts | acrylic acid/acrylate resin binder |

EXAMPLE 193-201

No mask nor light exposure.

EXAMPLE 193

0.20 g of the compound of example 1 are dissolved in 2.01 g of formulation B and applied according to the general procedure described above on 24×40 mm glass plates. At spinning speed of 1000 rpm, the following color point values are obtained: x=0.2575, y=0.1430, Y=15.13.

EXAMPLE 194

0.43 g of the compound of example 1 are dissolved in 4.53 g of formulation B and applied according to the general procedure described above on 52×75 mm glass plates. Contrast measurements are performed on a TSUBOSAKA ELECTRIC apparatus. The following values are obtained:

| spinning speed | 500 | 1000 | 1500 |
|---|---|---|---|
| contrast | 2062 | 2454 | 3009 |

EXAMPLE 195

0.20 g of the compound of example 2 are dissolved in 2.01 g of formulation B and applied according to the general procedure described above on 24×40 mm glass plates. At spinning speed of 1000 rpm, the following color point values are obtained: x=0.2295, y=0.0942, Y=7.90.

EXAMPLE 196

0.42 g of the compound of example 2 are dissolved in 4.52 g of formulation B and applied according to the general procedure described above on 52×75 mm glass plates. Contrast measurements are performed on a TSUBOSAKA ELECTRIC apparatus. The following values are obtained:

| spinning speed | 500 | 1000 | 1500 |
|---|---|---|---|
| layer thickness [μm] | 3.735 | 2.199 | 1.777 |
| contrast | 2368 | 2858 | 2739 |

EXAMPLE 197

0.20 g of the compound of example 3 are dissolved in 2.01 g of formulation B and applied according to the general procedure described above on 24×40 mm glass plates. At spinning speed of 1000 rpm, the following color point values are obtained: x=0.2295, y=0.0961, Y=8.19.

EXAMPLE 198

0.44 g of the compound of example 3 are dissolved in 4.55 g of formulation B and applied according to the general procedure described above on 52×75 mm glass plates. Contrast measurements are performed on a TSUBOSAKA ELECTRIC apparatus. The following values are obtained:

| spinning speed | 500 | 1000 | 1500 | 2000 |
|---|---|---|---|---|
| layer thickness [μm] | 3.235 | 1.881 | 1.786 | 1.576 |
| contrast | 2383 | 2555 | 2690 | 2979 |

EXAMPLE 199

(mixture of C. I. Pigment Blue 15:6 and compound of example 2): 4.00 g of formulation A are mixed with 4.00 g of formulation C. To 3.20 g of this mixture are added 0.80 g of a solution containing 0.40 g of the compound of example 2 dissolved in 4.06 g of cyclopentanone. The resulting resist formulation is applied according to the general procedure described above on 52×75 mm glass plates at various spinning speeds. The following values are obtained:

| spinning speed | | 1000 | 2000 | 3000 |
|---|---|---|---|---|
| colour point | x | 0.1531 | 0.1680 | 0.1815 |
| | y | 0.1080 | 0.1556 | 0.1865 |
| | Y | 9.17 | 15.59 | 20.67 |
| layer thickness [μm] | | 1.305 | 0.888 | 0.685 |
| contrast | | 1664 | 1906 | 2005 |

EXAMPLE 200

(mixture of C. I. Pigment Blue 15:6 and compound of example 3): 4.00 g of formulation A are mixed with 4.00 g of formulation C. To 3.20 g of this mixture are added 0.80 g of a solution containing 0.40 g of the compound of example 3 dissolved in 4.06 g of cyclopentanone. The resulting resist formulation is applied according to the general procedure described above on 52×75 mm glass plates at various spinning speeds. The following values are obtained:

| spinning speed | | 1000 | 2000 | 3000 |
|---|---|---|---|---|
| colour point | x | 0.1531 | 0.1682 | 0.1803 |
| | y | 0.1099 | 0.1580 | 0.1862 |
| | Y | 9.36 | 15.97 | 20.53 |
| layer thickness [μm] | | 1.294 | 0.881 | 0.685 |
| contrast | | 1838 | 1948 | 1996 |

EXAMPLE 201

Comparative (pure C. I. Pigment Blue 15:6) 1.56 g of formulation A are mixed with 1.41 g of formulation C. The resulting resist formulation is applied according to the general procedure described above on 52×75 mm glass plates at various spinning speeds. The following values are obtained:

| spinning speed | | 1000 | 2000 | 3000 |
|---|---|---|---|---|
| colour point | x | 0.1470 | 0.1565 | 0.1660 |
| | y | 0.1046 | 0.1478 | 0.1776 |
| | Y | 8.60 | 14.27 | 19.01 |
| layer thickness [μm] | | 1.737 | 1.230 | 0.936 |
| contrast | | 1440 | 1575 | 1855 |

EXAMPLES 202-204

General procedure for microlithography. Patterning is realized by irradiation through a mask enabling resolution ranging from 100 μm to 1 μm. The irradiation bandwidth of the UV lamp ranges from 300 nm to 410 nm with an energy intensity of 1.4 mW/cm$^2$. The developing bath is an aqueous basic developer prepared from commercial JSR 4625 in 2% concentration.

EXAMPLE 202

A solution containing 0.21 g of the compound of example 1 dissolved in 1.32 g of cyclopentanone is added to a formulation containing 0.19 g Disperbyk® 161, 0.44 g acrylic acid/acrylate resin binder, 0.22 g Sartomer® 399, 0.05 g 2,4-bis-(trichloromethyl)-6-(4-methoxyphenyl)-1,3,5-triazine. After filtration through a Teflon™ filter (0.45 μm), the resulting resist formulation is spin-coated on glass at a spinning speed of 1000 rpm and soft-baked for 2 minutes at 100° C. Irradiation through a mask for 30 seconds, followed by aqueous base development for 5 minutes results in a very well resolved pattern, which is further hot-baked at 200° C. for 5 minutes.

EXAMPLE 203

A solution containing 0.18 g of the compound of example 2 dissolved in 1.25 g of cyclopentanone is added to a formulation containing 0.19 g Disperbyk® 161, 0.41 g acrylic acid/acrylate resin binder, 0.24 g Sartomer® 399, 0.03 g 2,4-bis-(trichloromethyl)-6-(4-methoxyphenyl)-1,3,5-triazine. After filtration through a Teflon™ filter (0.45 μm), the resulting resist formulation is spin-coated on glass at a spinning speed of 1000 rpm and soft-baked for 2 minutes at 100° C. Irradiation through a mask for 30 seconds, followed by aqueous base development for 3 minutes results in a very well resolved pattern, which is further hot-baked at 200° C. for 5 minutes.

EXAMPLE 204

A solution containing 0.20 g of the compound of example 3 dissolved in 1.31 g of cyclopentanone is added to a formulation containing 0.20 g Disperbyk® 161, 0.49 g acrylic acid/acrylate resin binder, 0.21 g Sartomer® 399, 0.02 g 2,4-bis-(trichloromethyl)-6-(4-methoxyphenyl)-1,3,5-triazine. After filtration through a Teflon™ filter (0.45 μm), the resulting resist formulation is spin-coated on glass at a spinning speed of 1000 rpm and soft-baked for 2 minutes at 100° C. Irradiation through a mask for 30 seconds, followed by aqueous base development for 4 minutes results in a very well resolved pattern, which is further hot-baked at 200° C. for 5 minutes.

EXAMPLE 205

The same general procedure as described above in examples 193-198 is followed, with the difference that 1-methoxy-2-propyl-acetate (PGMEA) is used in place of cyclopentanone as organic solvent.

Formulation D:

| | |
|---|---|
| 4.36 parts | Disperbyk ® 161 (cationic polyurethane, dispersing agent) |
| 12.08 parts | acrylic acid/acrylate resin binder |
| 33.32 parts | 1-methoxy-2-propyl-acetate (PGMEA) |
| 6.5 parts | Sartomer ® 399 (dipentaerytritol pentaacrylate) |
| 0.65 parts | 2,4-bis(trichloromethyl)-6-(4-methoxyphenyl)-1,3,5-triazine |

0.10 g of the compound of example 3 are dissolved in 1.00 g of formulation D and applied according to the general procedure described above on 52×75 mm glass plates. At spinning speed of 1000 rpm, the following color point values are obtained: x=0.2540, y=0.1398, Y=14.29.

EXAMPLES 206-207

The same general procedure as described above in examples 109-114 is followed, but without using Disperbyk® 161.

Formulation E:

| | |
|---|---|
| 19.81 parts | acrylic acid/acrylate resin binder |
| 76.75 parts | cyclopentanone |
| 10.58 parts | Sartomer ® 399 (dipentaerytritol pentaacrylate) |
| 0.85 parts | 2,4-bis(trichloromethyl)-6-(4-methoxyphenyl)-1,3,5-triazine |

EXAMPLE 206

0.20 g of the compound of example 2 are dissolved in 2.00 g of formulation E and applied according to the general procedure described above on 52×75 mm glass plates. At spinning speed of 1000 rpm, the following color point values are obtained: x=0.2359, y=0.1116, Y=10.44.

EXAMPLE 207

0.20 g of the compound of example 3 are dissolved in 2.00 g of formulation E and applied according to the general procedure described above on 52×75 mm glass plates. At spinning speed of 1000 rpm, the following color point values are obtained: x=0.2318, y=0.1057, Y=9.65.

EXAMPLE 208

250 ml of chlorosulfonic acid are added dropwise at 23° C. to 50 g of 1-amino-2-(4-tert-butyl-phenoxy)-4-(2,4,6-trimethyl-phenylamino)-anthraquinone.

After completion of the addition (about 45 min), the reaction mixture is heated at 65° C. The reaction mixture is then carefully poured into 2 l of ice-water. After stirring for 30 minutes, the resulting violet suspension of 3-[4-amino-3-(4-tert-butyl-phenoxy)-9,10-dioxo-9,10-dihydro-anthracen-1-ylamino]-2,4,6-trimethyl-benzenesulfonyl chloride is filtered on a glass filter (porosity 3) and the presscake thereby obtained is washed with water and further used as a wet press-cake in the next step.

Approximately one half of this presscake is suspended in 500 ml of tetrahydrofuran. After dropwise addition of 15.12 g 2-amino-ethanol at 10° C. over 15 minutes, the reaction mixture is allowed to cool to 23° C. and stirred for 3 hours. Evaporation of the tetrahydrofuran with a rotary evaporator, followed by addition of 1 l of water to the residue affords a violet suspension which is filtered on a glass filter (porosity 3). The solid thus obtained is dissolved in acetone and the violet solution filtered on silica gel. Evaporation of the eluted filtrate on a rotary evaporator affords 27.42 g of a violet powder comprising two main components (determined by HPLC): 42.4% of $\lambda_{max}$ 300 nm+591 nm, 54.5% of $X_{max}$ 300 nm+589 nm (CH$_3$CN). The molecular weights as determined by ESI-LC-MS (negative ionisation, 0.1% CH$_3$OH-THF) are 694 g/mol and 750 g/mol, respectively:

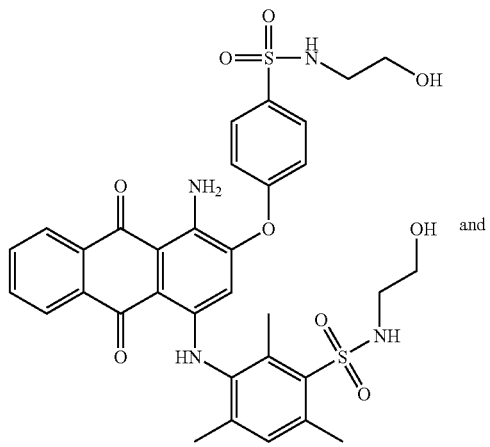

EXAMPLE 209

The second half of the presscake according to the first part of example 208 is suspended in 500 ml of tetrahydrofuran. After dropwise addition of 26 g diethanolamine at 15° C. over 15 minutes, the reaction mixture is allowed to cool to 23° C. and stirred for 3 hours. Evaporation of the tetrahydrofuran with a rotary evaporator, followed by addition of 1 l of water to the residue affords a violet suspension which is filtered on a glass filter (porosity 3). The solid thus obtained is dissolved in acetone and the violet solution filtered on silica gel. Evaporation of the eluted filtrate on a rotary evaporatory affords 27.65 g of a violet powder comprising two main components (determined by HPLC): 41.8% of $\lambda_{max}$ 300 nm+592 nm, 52.2% of $\lambda_{max}$ 300 nm+589 nm (CH$_3$CN). The molecular weights as determined by ESI-LC-MS (negative ionisation, 0.1% CH$_3$OH-THF) are 782 g/mol and 838 g/mol, respectively:

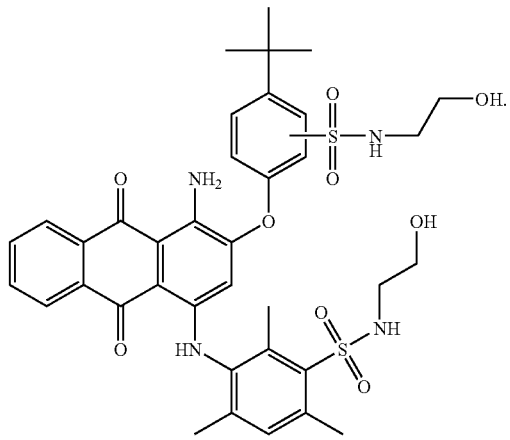

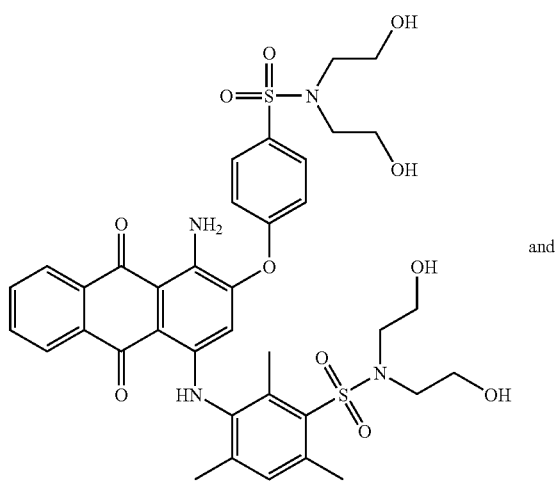

and

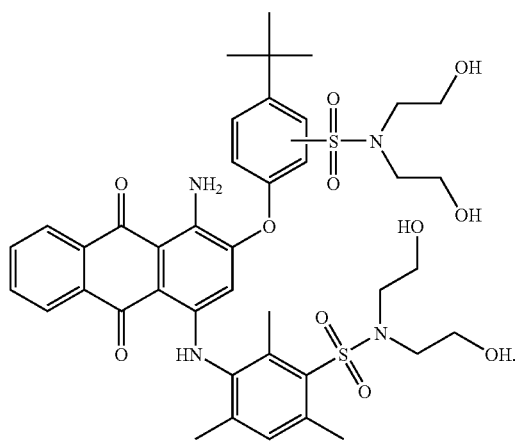

EXAMPLE 210

Following the same procedure as in examples 193-204, 0.02 g of the compound according to example 208 are dissolved in 0.20 g of formulation B and applied on 24×40 mm glass plates. At spinning speed of 1000 rpm, the following color point values are obtained: x=0.1958, y=0.0830, Y=6.20.

EXAMPLE 211

Following the same procedure as in examples 193-204, 0.02 g of the compound according to example 209 are dissolved in 0.20 g of formulation B and applied on 24×40 mm glass plates. At spinning speed of 1000 rpm, the following color point values are obtained: x=0.1934, y=0.0767, Y=5.77.

EXAMPLE 212

150 ml of chlorosulfonic acid are placed in a flask and cooled down to 0° C. Portionwise addition of 20 g 1-amino-2-(4-tert-butyl-phenoxy)-4-(2,4,6-trimethyl-phenylamino)-anthraquinone is performed slowly over 11 minutes, leading to a reaction mixture temperature of 5° C. at the end of the addition. After stirring for 30 minutes, the reaction mixture is slowly poured into 2 l of ice-water. After again stirring for 30 minutes, the resulting violet suspension is filtered on a glass filter (porosity 3) and the presscake thus obtained is further used as a wet press-cake in the next step.

The presscake is suspended in tetrahydrofuran and cooled down to 5° C. Dropwise addition of 12.49 g of 2-(2-amino-ethoxy)-ethanol is performed at 5° C. over a period of 15 minutes and the reaction mixture is then allowed to stir and cool to 23° C. over 3 hours. Evaporation of the tetrahydrofuran with a rotary evaporator affords an oily residue which is triturated with water. After decantation of the water, the residue is dried at 60° C./5·10³ Pa for 3 hours.

After dissolution in dichloromethane of the dried product, elution on silica gel with dichloromethane eliminates the first spot; further elution with acetone affords a second fraction which is evaporated on a rotary evaporator and dried for 3 hours at 60° C./5·10³ Pa. The powder thus obtained is further purified by filtration on silica gel, eluting with dichloromethane/acetone (4:1). Solvent evaporation provides 9.99 g of a violet powder.

EXAMPLE 213

800 ml of chlorosulfonic acid are placed in a flask and cooled down to 0° C. Portionwise addition of 105 g 1-amino-2-(4-tert-butyl-phenoxy)-4-(2,4,6-trimethyl-phenylamino)-anthraquinone is performed slowly and the reaction mixture temperature is kept at 5° C. at the end of the addition. After stirring for 55 minutes, the reaction mixture is slowly poured into 2 l of ice-water-sodium chloride under stirring and the temperature of the reaction mixture is allowed to reach 15° C. The addition is finished after 50 minutes and the resulting violet suspension is filtered on a glass filter (porosity 3); the presscake thus obtained is washed with cold water and further used as a wet press-cake in the next step.

The presscake is suspended in 1.5 l of tetrahydrofuran and cooled down to 10° C. Dropwise addition of 66.20 g of 2-(2-amino-ethoxy)-ethanol is performed under nitrogen at 10° C. over a period of 15 minutes and the reaction mixture is then allowed to stir and cool to 23° C. over 4 hours. After evaporation of the tetrahydro-furan with a rotary evaporator and addition of 2 l of water, the suspension is filtered on a glass filter (porosity 3) and the solid is dried at 60° C./5·10³ Pa for 3 hours. After dissolution of the residue in 3 l of dichloromethane/acetone (4:1), 1 kg of silica gel is slowly added and the mixture is stirred and homogenized. Filtration on a glass filter (porosity 4) followed by evaporation of the filtrate with a rotary evaporator affords a residue which is dissolved in 2 l of dichloromethane/acetone (4:1) and again evaporated to dryness. Drying at 60° C./5·10³ Pa for 7 hours affords 60.75 g of violet powder.

EXAMPLE 214

40 ml of chlorosulfonic acid are placed in a flask and cooled down to −5° C. Portionwise addition of 5 g 1-amino-2-(4-tert-butyl-phenoxy)-4-(2,4,6-trimethyl-phenylamino)-anthraquinone is performed slowly. The reaction mixture is kept at 0° C. and stirred for 40 minutes, then slowly poured into 100 ml of ice-water-sodium chloride under stirring over 10 minutes. The resulting violet suspension is filtered on a glass filter (porosity 3); the presscake thus obtained is washed with cold water and further used as a wet press-cake in the next step.

2 g of 2-(2-amino-ethoxy)-ethanol in 50 ml of ice/water are placed into a reaction flask, to which is added approximately one half of the wet press-cake prepared above. The reaction mixture is heated at 50° C. for 3 hours, after which heating is stopped and the reaction mixture is allowed to cool to 23° C. Filtration on a glass filter (porosity 3) followed by washing with water and subsequent drying at 60° C./5·10³ Pa for 3 hours affords 3.2 g of a violet powder.

EXAMPLE 215

800 ml of chlorosulfonic acid are placed in a flask and cooled down to −5° C. Portionwise addition of 105 g 1-amino-2-(4-tert-butyl-phenoxy)-4-(2,4,6-trimethyl-phenylamino)-anthraquinone is performed slowly and the reaction mixture temperature is not allowed to rise above 1° C. and it is −2° C. at the end of the addition. After stirring for 30 minutes at −2° C. and further cooling down to −18° C. for approximately 30 minutes, the reaction mixture is allowed to reach 0° C. and thin layer chromatography indicates total consumption of the reagent 1-amino-2-(4-tert-butyl-phenoxy)-4-(2,4,6-trimethyl-phenylamino)-anthraquinone. The reaction mixture is then carefully poured into 800 ml of ice-water-sodium chloride under stirring and the temperature of the reaction mixture is allowed to reach 15° C. The addition is finished after 30 minutes and the resulting violet suspension is filtered. The presscake thus obtained is washed with 5 l of water and further used as a wet press-cake in the next step.

A reaction flask containing 88.3 g of 2-(2-amino-ethoxy)-ethanol dissolved in 400 ml of ice/water is cooled down to 5° C. The previously prepared press-cake is added portionwise to the reaction flask and another portion of 200 ml of 2-(2-amino-ethoxy)-ethanol is further added. The reaction mixture is then heated under stirring to 55° C. for 30 minutes and then allowed to cool to 23° C. The raw material is isolated by filtration and dried at 60° C./5·10³ Pa for 3 hours. Dissolution in acetone/hexan (7:3) followed by filtration on silica gel (6 l of same eluent) affords 89.14 g of a violet powder after evaporation of the solvents on a rotary evaporator.

EXAMPLE 216

560 ml of chlorosulfonic acid are placed in a flask and cooled down to −5° C. Portionwise addition of 70 g 1-amino-2-(4-tert-butyl-phenoxy)-4-(2,4,6-trimethyl-phenylamino)-anthraquinone is performed slowly; the reaction mixture temperature is not allowed to go above 5° C. and is 0° C. at the end of the addition. After stirring for 40 minutes at 0° C., the reaction mixture is carefully poured into 2 l of ice-water-sodium chloride under stirring and the temperature of the reaction mixture is kept at 0° C. The addition is finished after 60 minutes and the resulting violet suspension is filtered. The presscake thus obtained is washed 3 times with each 3 l of water after which the pH of the filtrate is still 1.7. The presscake is further used as a wet press-cake in the next step.

To a suspension of the above prepared presscake into 400 ml ice/water are slowly added 58.4 g of 2-(2-amino-ethoxy)-ethanol. The reaction mixture is heated at 47° C. for 6.5 hours and then hot filtered. The presscake is further dispersed by stirring in 500 ml of water and heated to 80° C. Filtration, repeated washings with hot water until the filtrate is colorless and final filtration afford a product which is dissolved in acetone, filtered and evaporated to dryness on a rotary evaporator. Drying of the residue at 60° C./5·10³ Pa for 8 hours affords 43 g of a violet powder.

EXAMPLE 217

115 ml of chlorosulfonic acid are placed in a flask and cooled down to −5° C. Portionwise addition of 15 g 1-amino-2-(4-tert-butyl-phenoxy)-4-(2,4,6-trimethyl-phenylamino)-anthraquinone is performed slowly over 8 minutes and the reaction mixture temperature is not allowed to go above 0° C. After stirring for 20 minutes at 1° C., the reaction mixture is carefully poured into 1 l of ice-water-sodium chloride under stirring. The addition is finished after 25 minutes and the resulting violet suspension is filtered. The presscake thus obtained is washed with 500 ml of cold water, twice suspended in 700 ml ice/water and each time filtered. To the wet presscake suspended into 200 ml ice/water at 10° C., 12.48 g of 2-(2-amino-ethoxy)-ethanol are slowly added over 5 minutes. The reaction mixture is heated up to 55° C. for 18 hours and then filtered hot on a glass filter (porosity 4). The presscake is further repeatedly washed with warm water (totally 1200 ml) and then dried at 60° C./5·10³ Pa for 12 hours to afford 16.23 g of a violet powder.

The below differential scanning calorimetry (DSC), HPLC, elemental analysis (CHNOS) and mass spectroscopy (MS) data allow a comparison:

| Ex. | DSC [° C.] | HPLC [%]* | MS [g/mol] | Elemental analysis [%] |
|---|---|---|---|---|
| 3 | 173 | 93 | 614; 671* | C 65.96, H 6.15, N 5.77, O 16.58, S 4.63 |
| 212 | 81 | 96 | 671* | C 66.03, H 5.86, N 6.06, O 16.80, S 4.70 |
| 213 | 176 | 94 | 614; 671* | C 65.94, H 6.27, N 6.02, O 16.70, S 4.82 |
| 214 | 88 | 83 | 584; 615; 671*; 695; 751 | C 64.44, H 5.54, N 6.10, O 17.58, S 5.15 |
| 215 | 75 + 130 | 91 | 614; 671*; 782 | C 64.23, H 6.36, N 6.00, O 18.25, S 4.87 |
| 216 | 83 + 132 | 86 | 584; 615; 671*; 751 | C 64.12, H 6.11, N 6.12, O 18.45, S 5.27 |
| 217 | 91 | 84 | 584; 605; 671*; 695; 751 | C 64.88, H 5.86, N 6.02, O 17.55, S 4.85 |

*main component as determined by HPLC

The comparison of DSC data of examples 3 and 212 to 217 is surprising, because the pattern of melting is not consistent. Examples 3 and 213 exhibit one single endothermic peak around 174° C., whereas examples 212, 214 and 217 exhibit a single peak around 85° C. Additionally, examples 215 and 216 exhibit two distinct endothermic peaks around 80° C. and 130° C., indicating the presence of a liquid crystalline phase (see Liquid Crystals 27/8, 1075-1085 [2000]).

All samples comprise the following main component of molecular weight 671 g/mol in a purity of at least 83% according to HPLC:

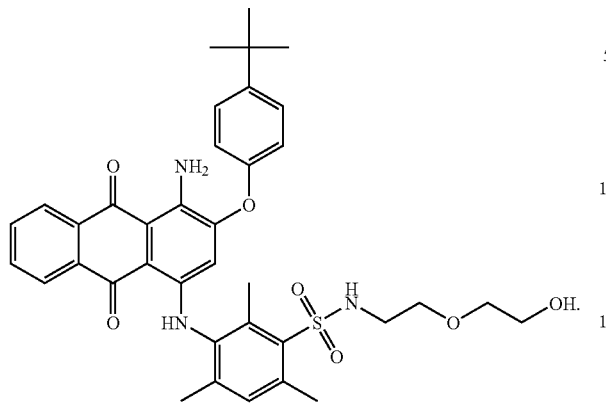

The further components of m/e 584, 614/615, 695, 751 and 782 g/mol as detected by mass spectroscopy can be assigned to following structures $M^+$ or $MH^+$ ($R_{66}$=[(CH$_2$)$_2$O]$_2$H).

[583]

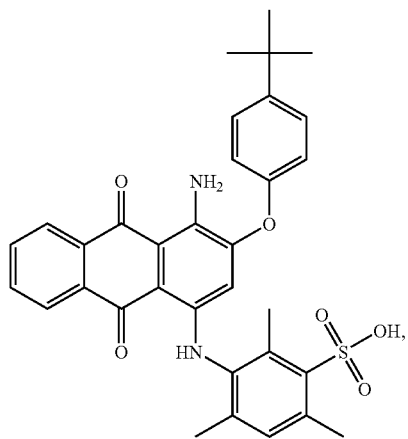

[614]

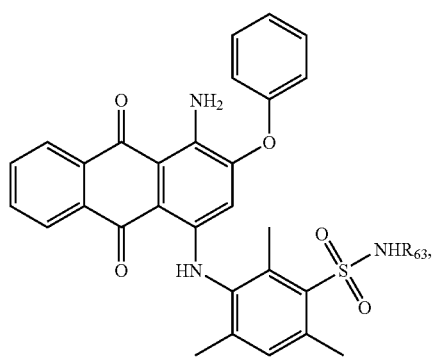

[694]

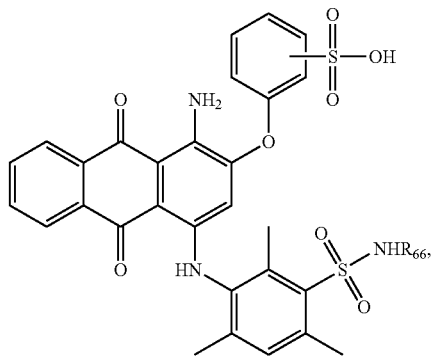

[750]

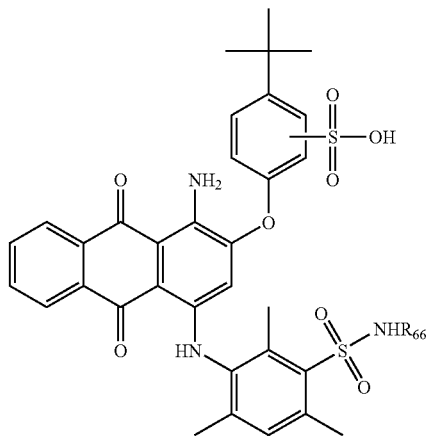

and

[781]

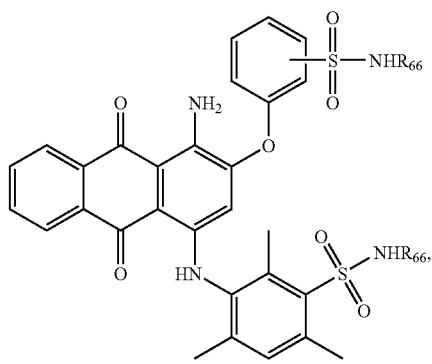

respectively.

The invention claimed is:

1. A process for enhancing the contrast of color filters comprising α copper phthalocyanine or ε copper phthalocyanine, wherein
   a 1,4-diamino-anthraquinone dye or 1,9-annellated derivative thereof, of which the most bathochromic dichloromethane solution absorption peak in the visible spectrum is at from 575 to 615 nm,
   is added to α copper phthalocyanine or ε copper phthalocyanine and dispersed together with the copper phthalocyanine in a liquid medium;
   is added to a suspension comprising a liquid and α copper phthalocyanine or ε copper phthalo-cyanine, which suspension is then dispersed;
   is added to a dispersion comprising a liquid and α copper phthalocyanine or ε copper phthalo-cyanine; or is added to a liquid, followed by addition of α copper phthalocyanine or ε copper phthalocyanine and dispersion into the liquid;

the resulting dispersion comprising both α copper phthalocyanine or ε copper phthalocyanine and the 1,4-diamino-anthraquinone dye or 1,9-annellated derivative thereof is applied to a substrate; and a color filter layer is formed by drying and/or curing;

wherein the 1,4-diamino-anthraquinone dye or 1,9-annellated derivative thereof is of formula (I)

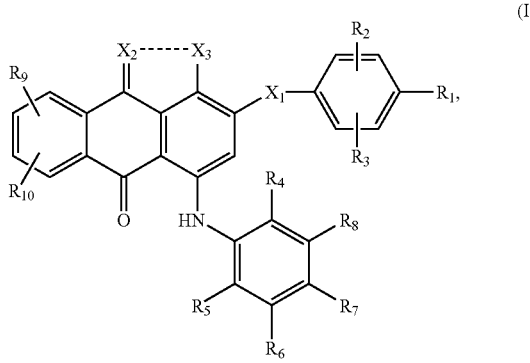
(I)

wherein $X_1$ is O or S;

$X_2$ is O and $X_3$ is $NH_2$ or $NHR_{11}$; or $X_2$ and $X_3$ are together $=C(R_{12})-CON(R_{11})-$ or $=N-C(R_{12})=N-$;

$R_1$, $R_2$, $R_3$, $R_4$, $R_5$, $R_6$, $R_7$, $R_9$ and $R_{10}$ are each independently from all others H, halogen, CN, $CONR_{13}R_{14}$ or $COOR_{14}$, or benzyl or $C_1-C_{20}$alkyl which are unsubstituted or substituted one or more times by halogen, CN, $CONR_{13}R_{14}$ or $COOR_{14}$;

or $R_2$ and/or $R_9$ are alternatively $SO_2NR_{13}R_{14}$;

$R_8$ is H, $CONR_{13}R_{14}$ or $SO_2NR_{13}R_{14}$;

$R_{11}$ and $R_{12}$ are each independently from all others benzyl or $C_1-C_{20}$ alkyl which are unsubstituted or one or more times substituted b halogen, OH, $O-C_1-C_{20}$alkyl or CN; or $R_{12}$ is alternatively H;

each $R_{13}$ independently from any other $R_{13}$ is H or $R_{15}$;

$R_{14}$ and $R_{15}$ independently from one another and each $R_{14}$ or $R_{15}$ independently from any other $R_{14}$ or $R_{15}$ are $C_1-C_{20}$alkyl, $C_3-C_{20}$cycloalkyl, $C_2-C_{20}$alkenyl, $C_2-C_{20}$alkynyl, $C_3-C_{20}$cycloalkenyl or $C_7-C_{20}$aralkyl which are each unsubstituted or substituted one or more times by halogen, hydroxy, amino, oxo, thio, $C_1-C_8$alkylamino, di($C_1-C_8$alkyl)amino, $C_1-C_8$alkoxy or $C_1-C_8$alkylthio; and when $R_{14}$ and $R_{15}$ comprise aliphatic chains, the aliphatic chains are uninterrupted or interrupted from 1 to $$\frac{n-2}{2}$$

times by O, S, NH or N($C_1-C_8$alkyl), n being the total number of aliphatic carbon atoms in $R_{14}$ and $R_{15}$; and $R_{14}$ and $R_{15}$ can optionally be linked together through an additional direct bond between them;

and two radicals of formula (I) can optionally be linked together via a direct bond or a group —O—, —S—, —$NR_{14}$—, —CO—, —$CONR_{14}$— or —$CO_2$— connecting together each a substituent $R_1$, $R_2$, $R_3$, $R_4$, $R_5$, $R_6$, $R_7$, $R_8$, $R_9$, $R_{10}$, $R_{11}$, $R_{12}$ and $R_{14}$ from both radicals of formula (I).

2. A process according to claim 1, wherein the 1,4-diamino-anthraquinone dye or 1,9-annellated derivative thereof is of formula

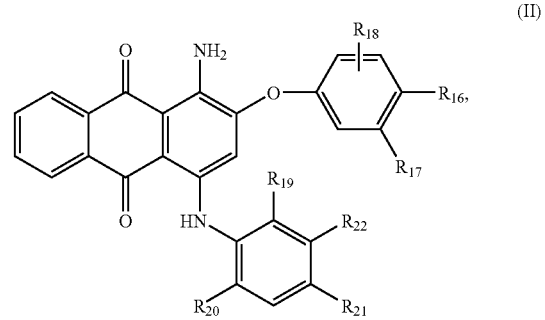
(II)

wherein $R_{16}$ is halogen, phenyl, benzyl or $C_1-C_8$alkyl and $R_{17}$ is H, $R_{16}$ is H and $R_{17}$ is $C_1-C_8$alkyl, or $R_{16}$ and $R_{17}$ are both H;

$R_{18}$ is H, halogen, $C_1-C_8$alkyl or $SO_2NR_{13}R_{14}$;

$R_{19}$, $R_{20}$ and $R_{21}$ are each independently from the others halogen or $C_1-C_8$alkyl; and $R_{22}$ is H or independently from $R_{18}$, $SO_2NR_{13}R_{14}$.

3. A process according to claim 2, wherein $R_{18}$ is H or $SO_2NR_{13}R_{14}$; and $R_{22}$ is H or independently from $R_{18}SO_2NR_{13}R_{14}$.

4. A process for enhancing the contrast of color filters according to claim 1, wherein the 1,4-diamino-anthraquinone dye or 1,9-annellated derivative is a compound of which the most bathochromic dichloromethane solution absorption peak in the visible spectrum of the is at from 585 to 605 nm.

* * * * *